(12) United States Patent
Yu et al.

(10) Patent No.: US 6,506,639 B1
(45) Date of Patent: Jan. 14, 2003

(54) METHOD OF FORMING LOW RESISTANCE REDUCED CHANNEL LENGTH TRANSISTORS

(75) Inventors: Allen S. Yu, Fremont, CA (US); Paul J. Steffan, Elk Grove, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 90 days.

(21) Appl. No.: 09/691,717

(22) Filed: Oct. 18, 2000

(51) Int. Cl.[7] .................... H01L 21/336; H01L 21/8234
(52) U.S. Cl. .................. 438/197; 438/210; 438/223; 438/303; 438/595; 438/301
(58) Field of Search .............................. 438/210, 211, 438/216, 217, 218, 223, 221, 224, 239, 240, 287, 294, 296, 303, 3, 197, 289, 299, 301, 305, FOR 216, FOR 211, 595; 257/344, 336, 411

(56) References Cited

U.S. PATENT DOCUMENTS

| 5,953,599 A | * | 9/1999 | El-Diwany | ................ 438/199 |
| 6,066,533 A | * | 5/2000 | Yu | ................ 438/275 |
| 6,159,782 A | * | 12/2000 | Xiang et al. | ................ 438/197 |
| 6,174,767 B1 | * | 1/2001 | Chi | ................ 438/253 |
| 6,184,114 B1 | * | 2/2001 | Lukanc | ................ 438/585 |
| 6,200,866 B1 | * | 3/2001 | Ma et al. | ................ 438/299 |

OTHER PUBLICATIONS

Horiuchi et al. "An asymmetric sidewall process for high performance LDD MOSFET's", 1994, IEEE, pp. 186–190.*
Guo et al. "Performance an reliability evaluation of high dielctric LDD dpacer on depp sub–micrometer LDD MOSFET", 1994, IEEE, pp. 1239–1248.*

* cited by examiner

Primary Examiner—Stephen D. Meier
Assistant Examiner—Maria Guerrero
(74) Attorney, Agent, or Firm—Wagner Murabito & Hao LLP

(57) ABSTRACT

Methods of manufacturing semiconductor devices having low resistance reduced channel length transistors. Spacers are formed on each side of trenches that define the location of transistor channels. The spacers are formed with a dimension between the spacers that is less than a dimension available from photolithography systems currently available. A layer of gate oxide and a polysilicon gate are formed within the dimension resulting in transistors having channels length less than that available from standard photolithographic methods of forming gates and channels.

10 Claims, 22 Drawing Sheets

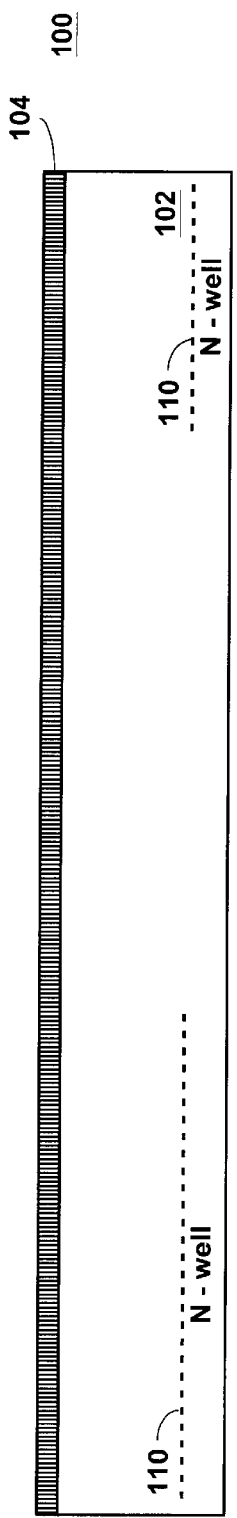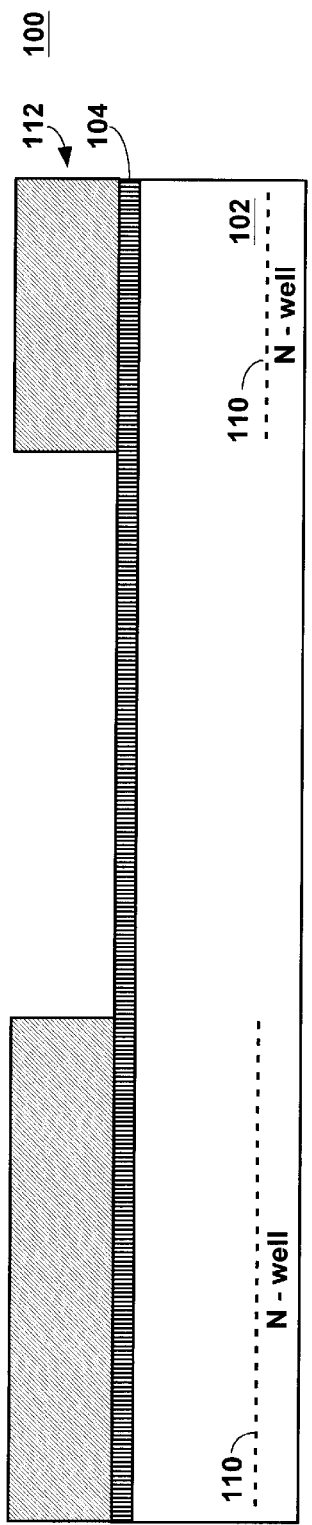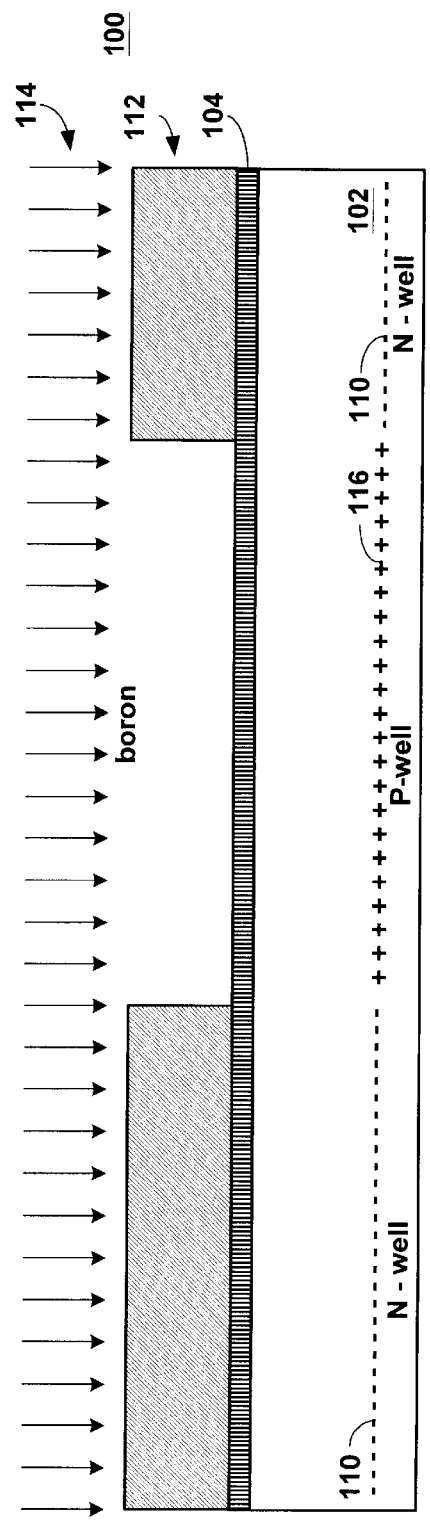

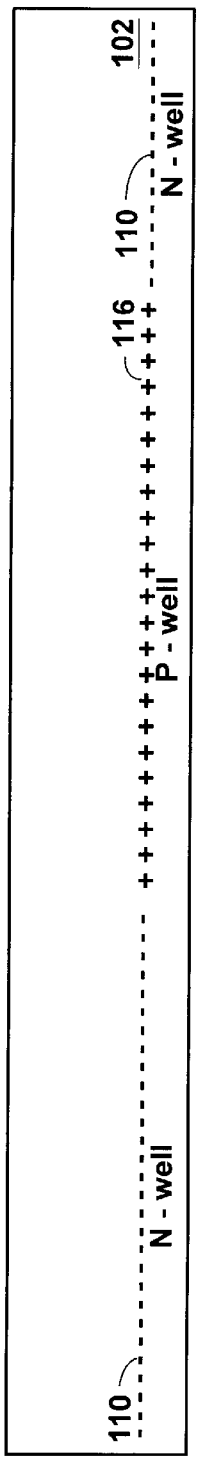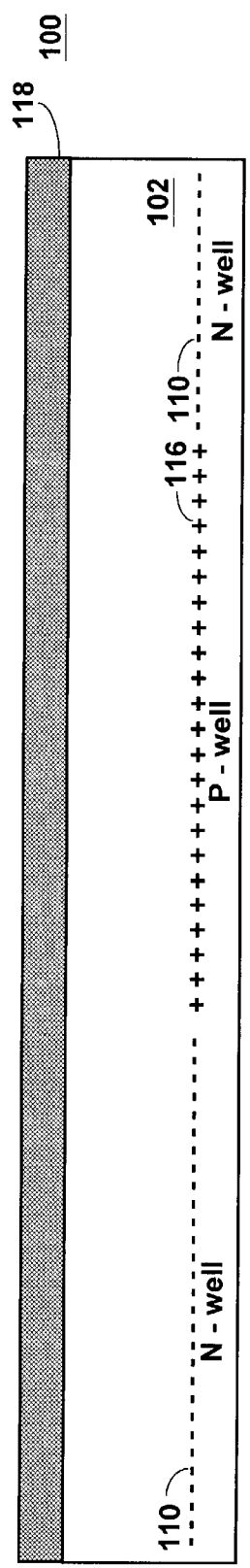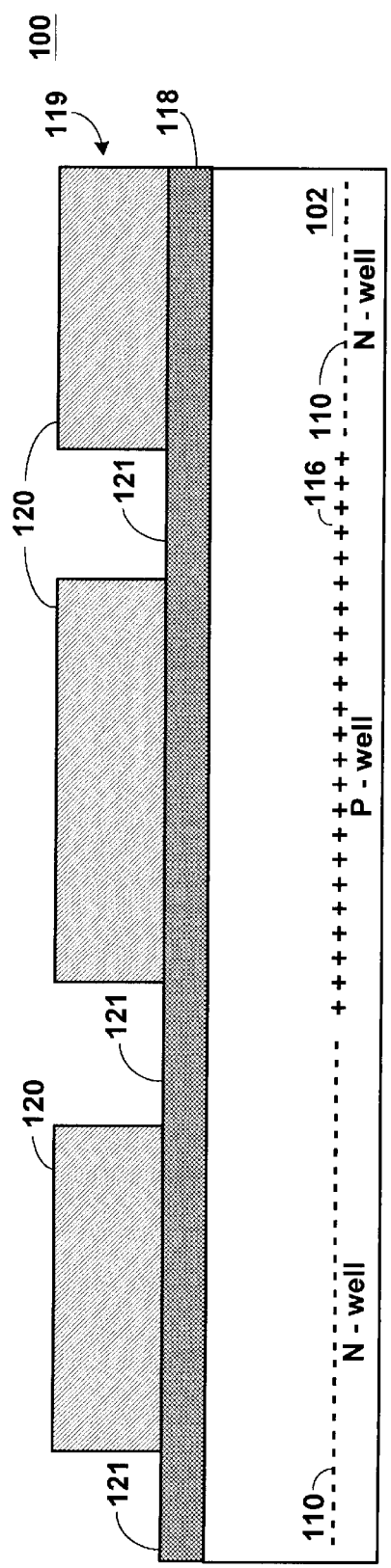
FIGURE 1F
FIGURE 1G
FIGURE 1H

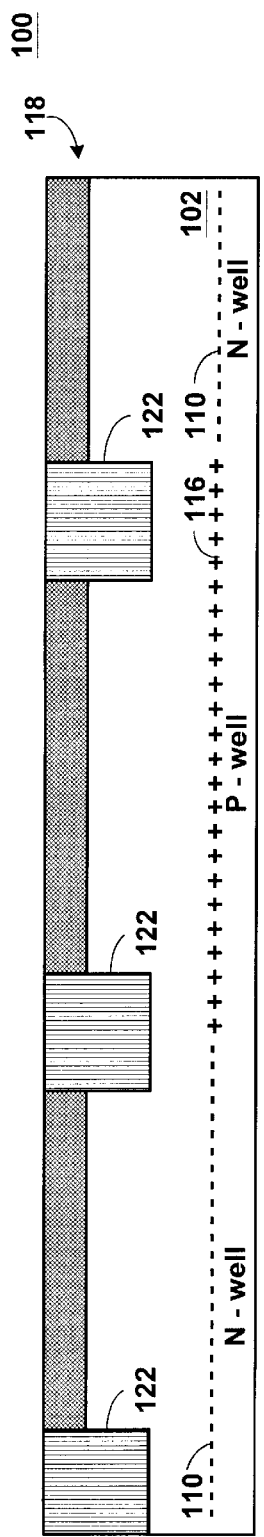
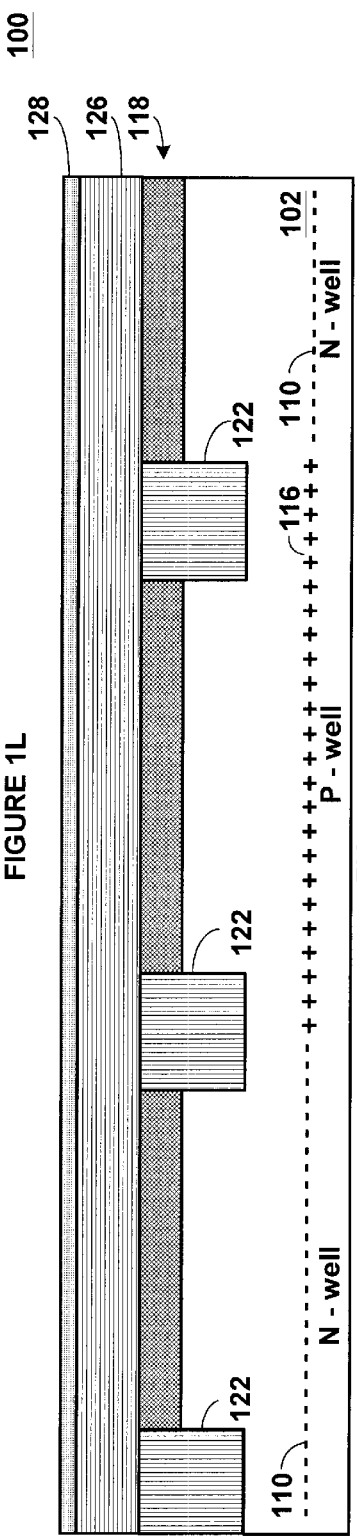
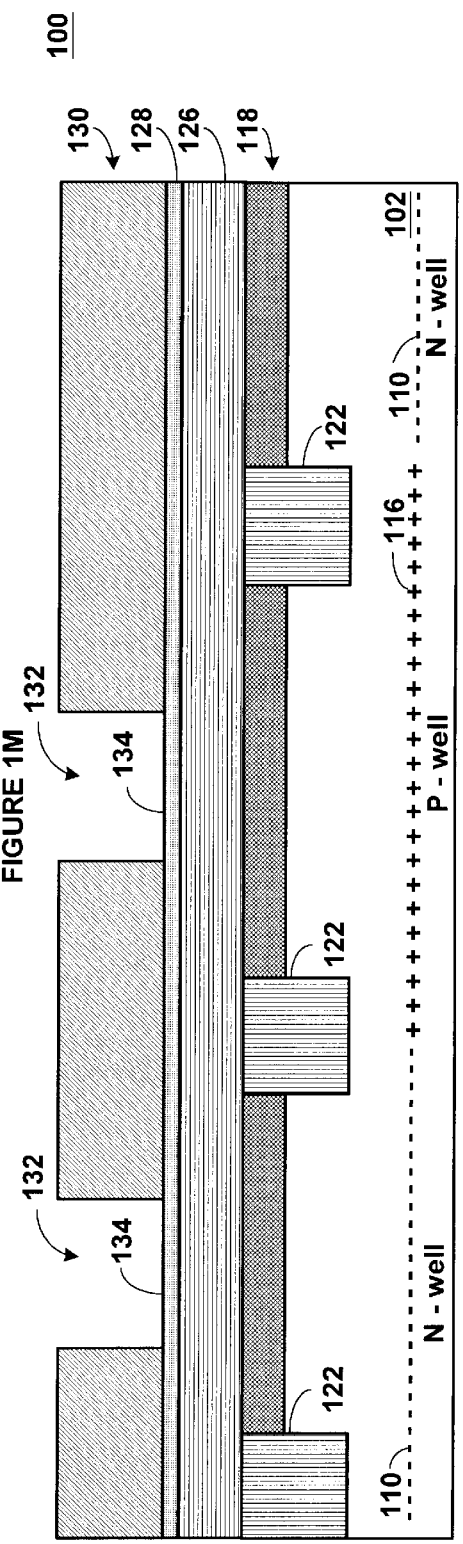
FIGURE 1L
FIGURE 1M
FIGURE 1N

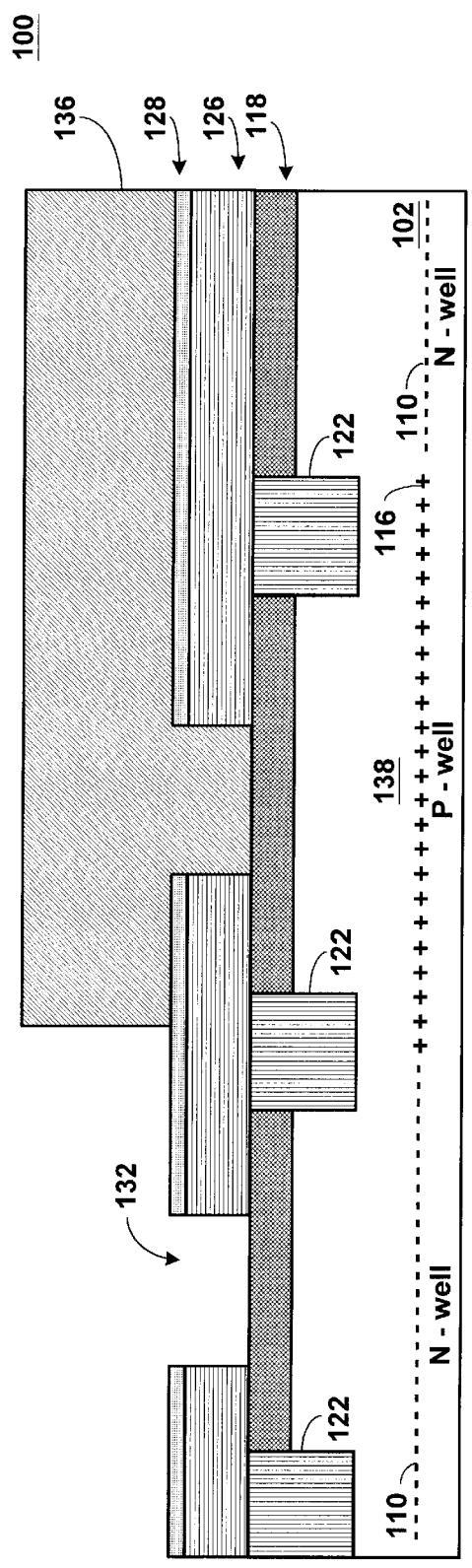
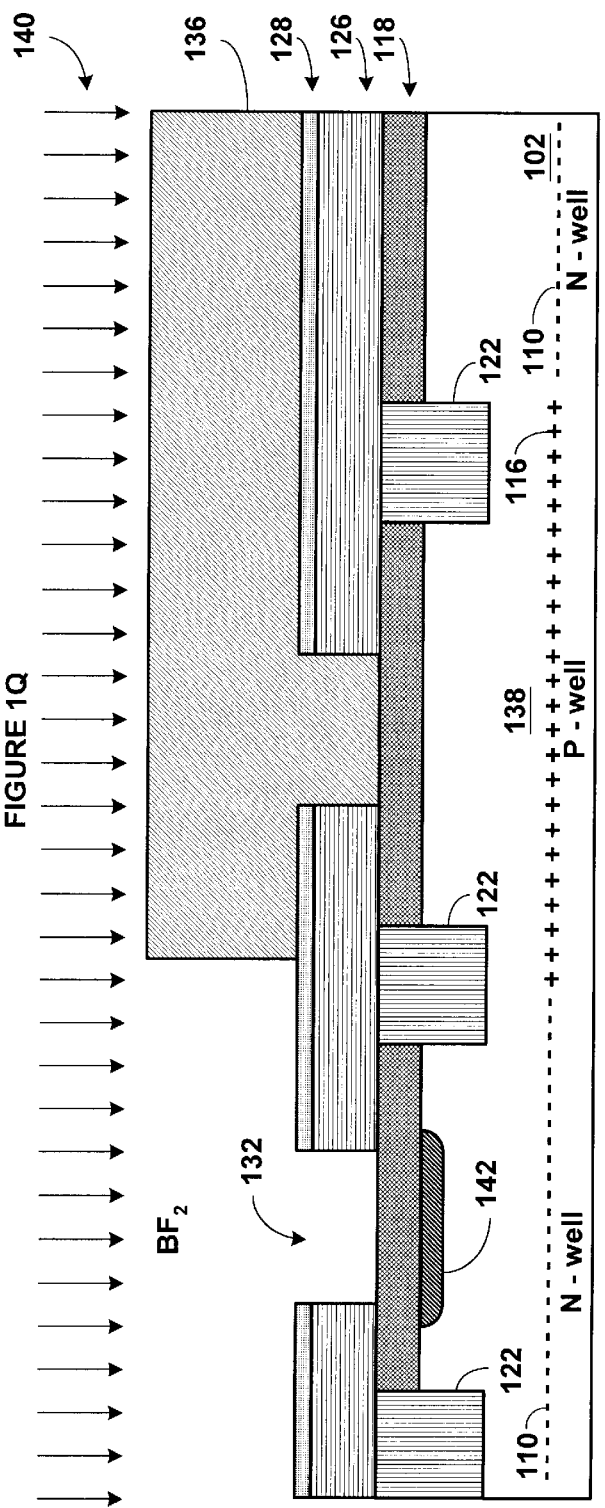

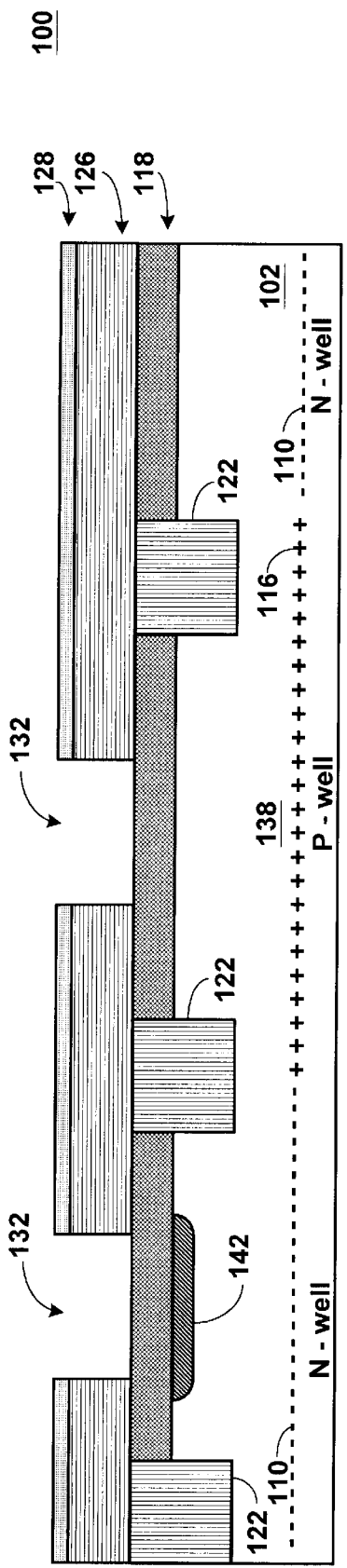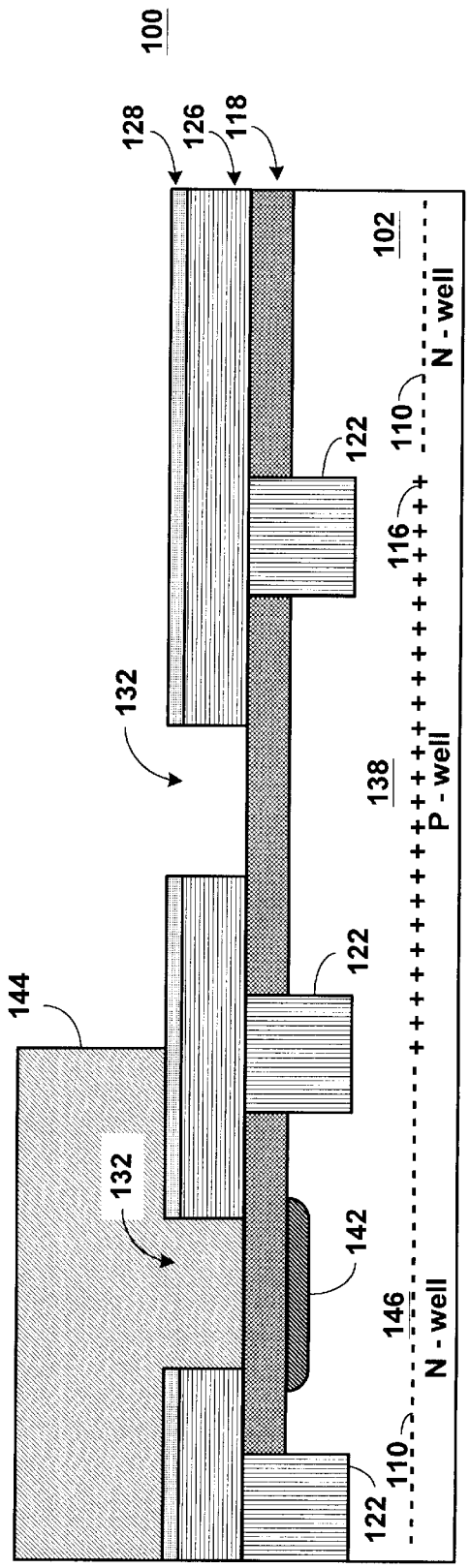

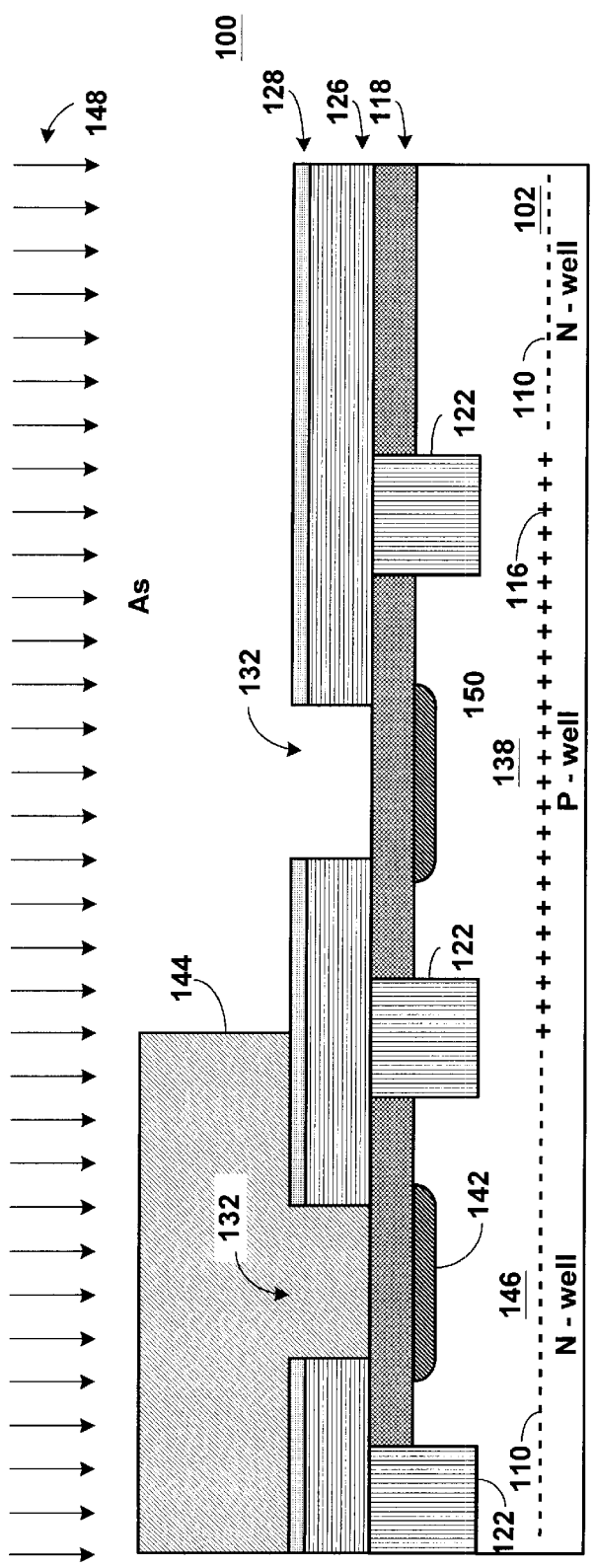
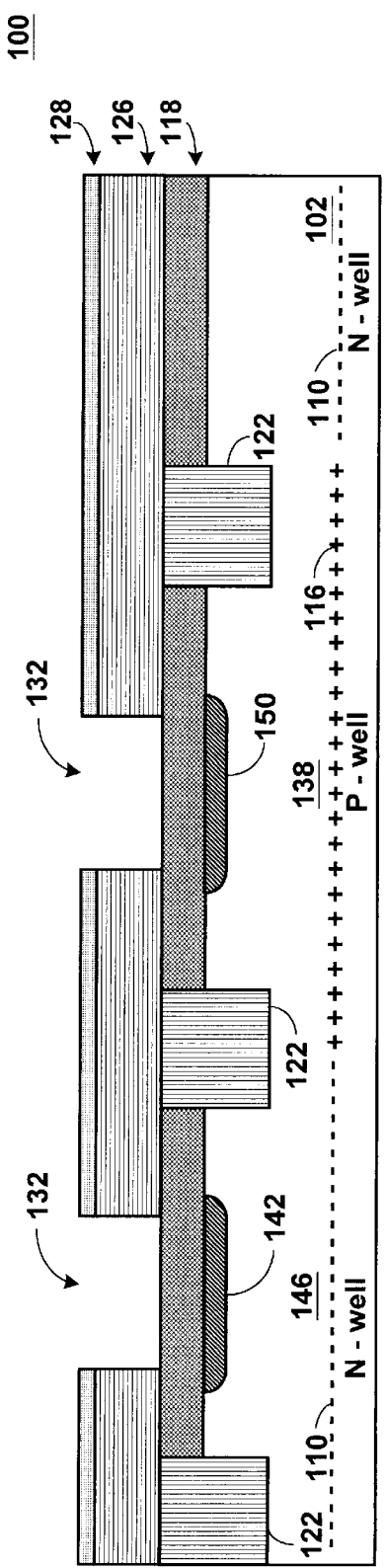
FIGURE 1U
FIGURE 1V

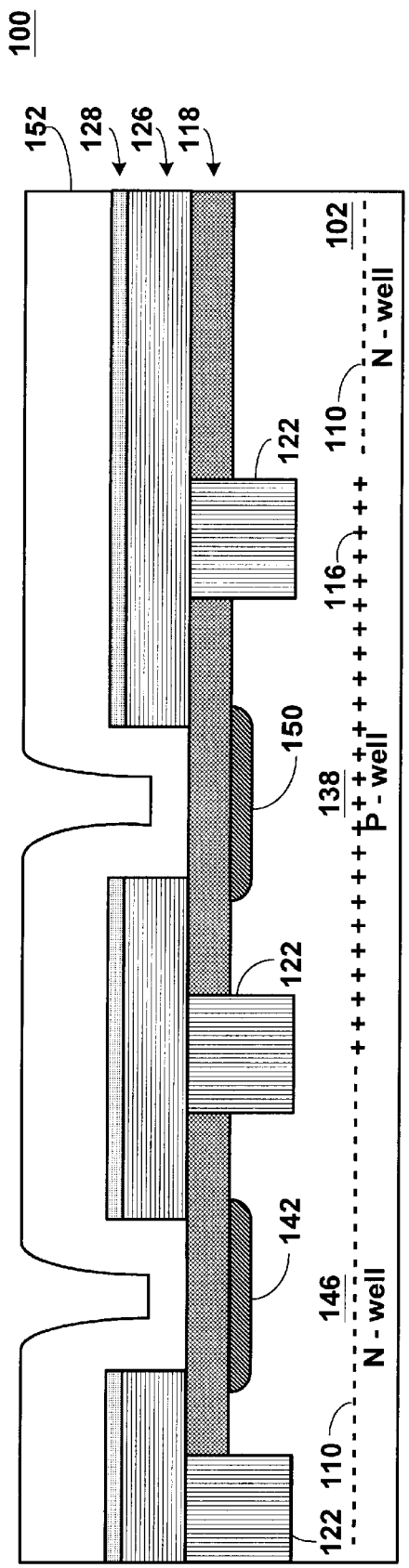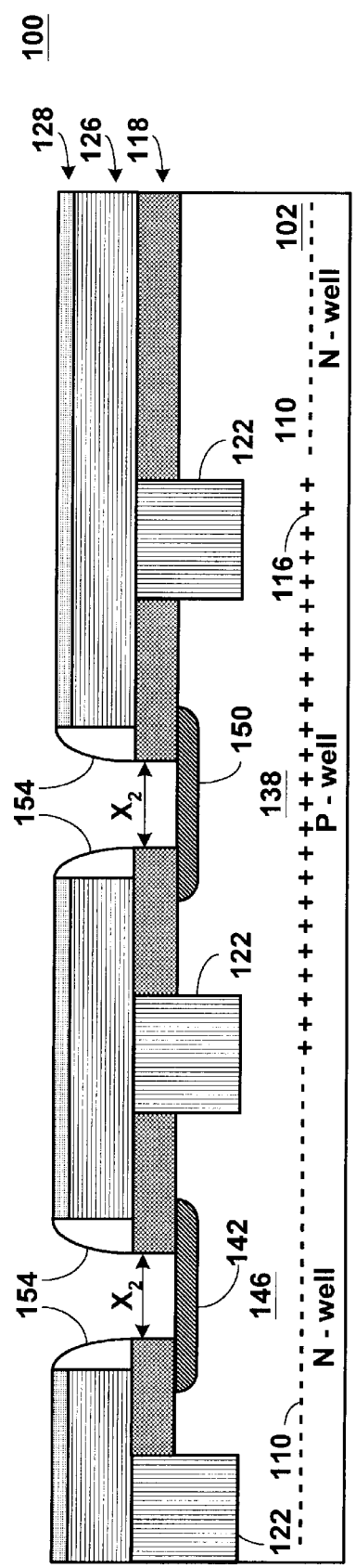
FIGURE 1W
FIGURE 1X

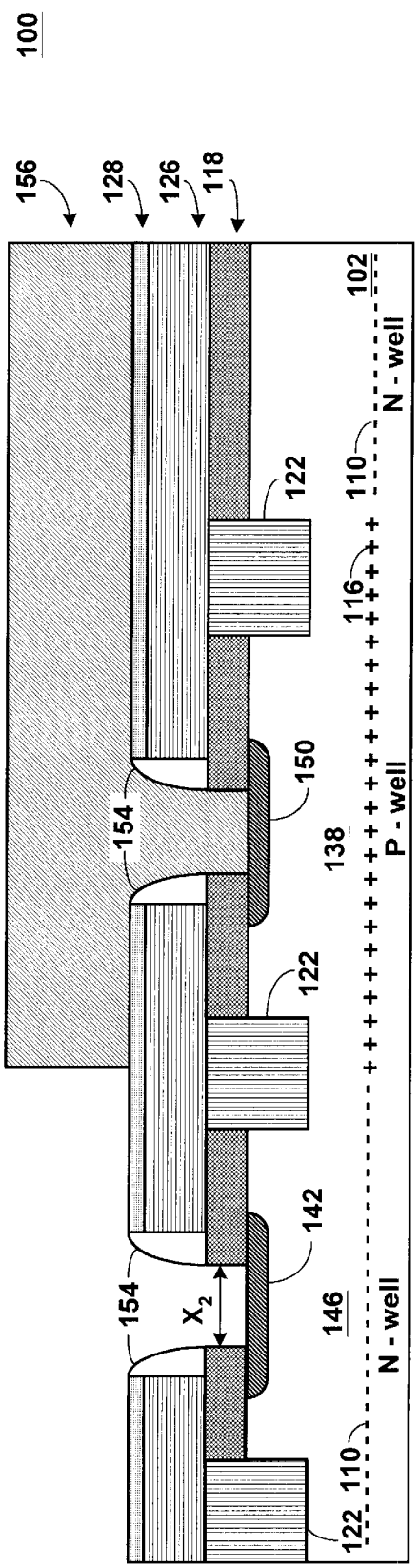
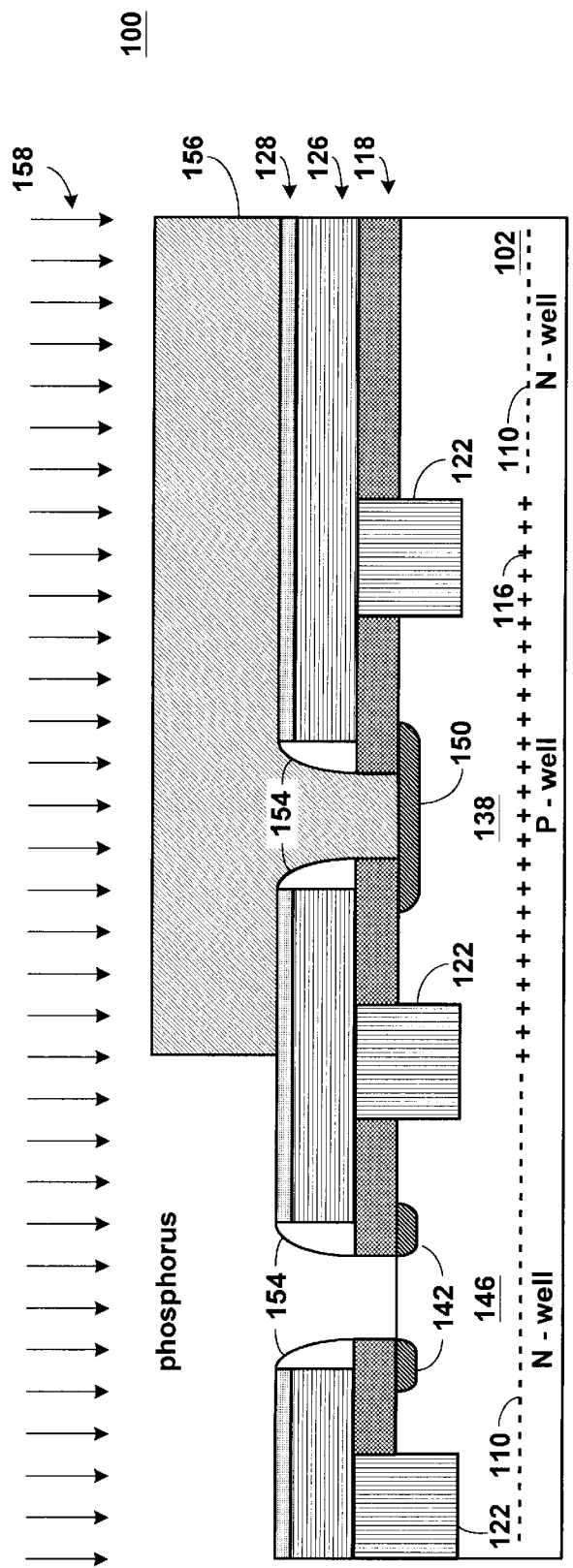

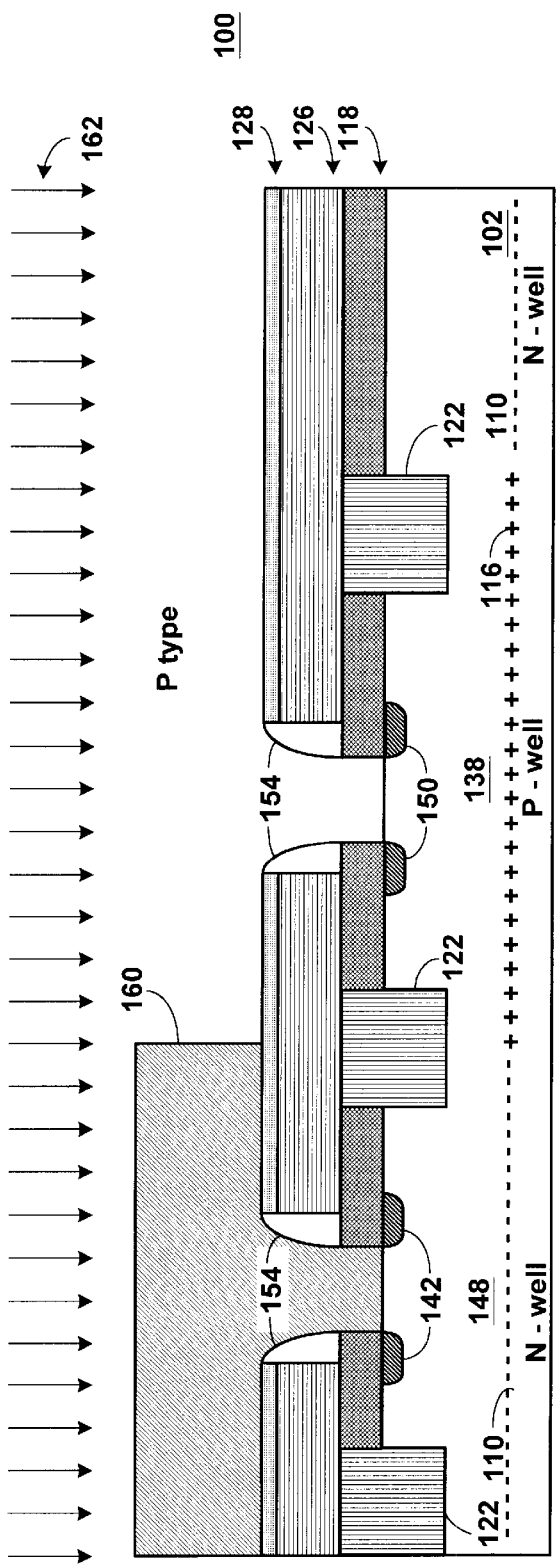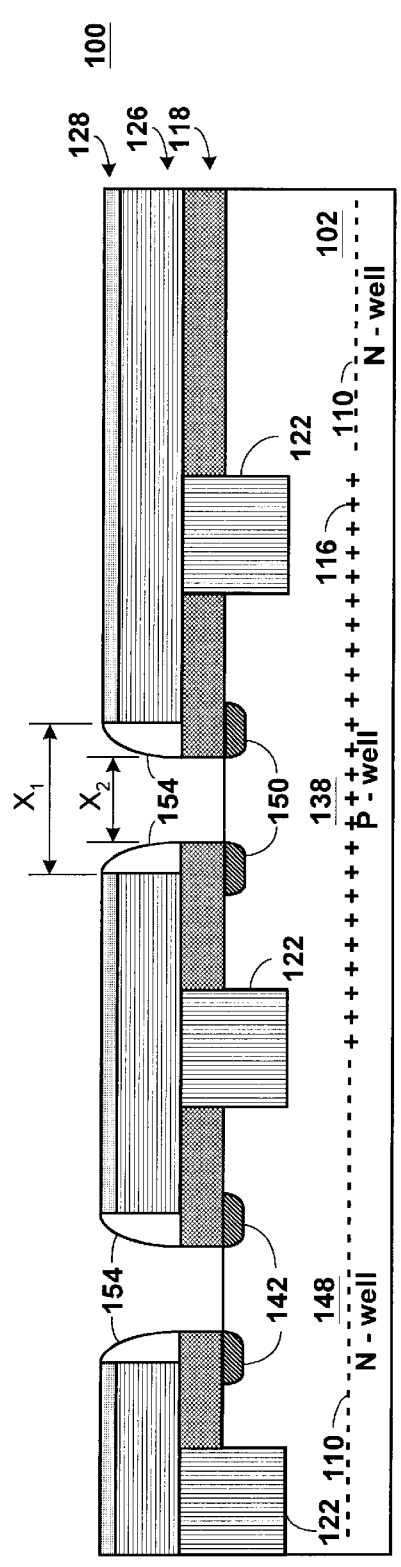
FIGURE 1AC
FIGURE 1AD

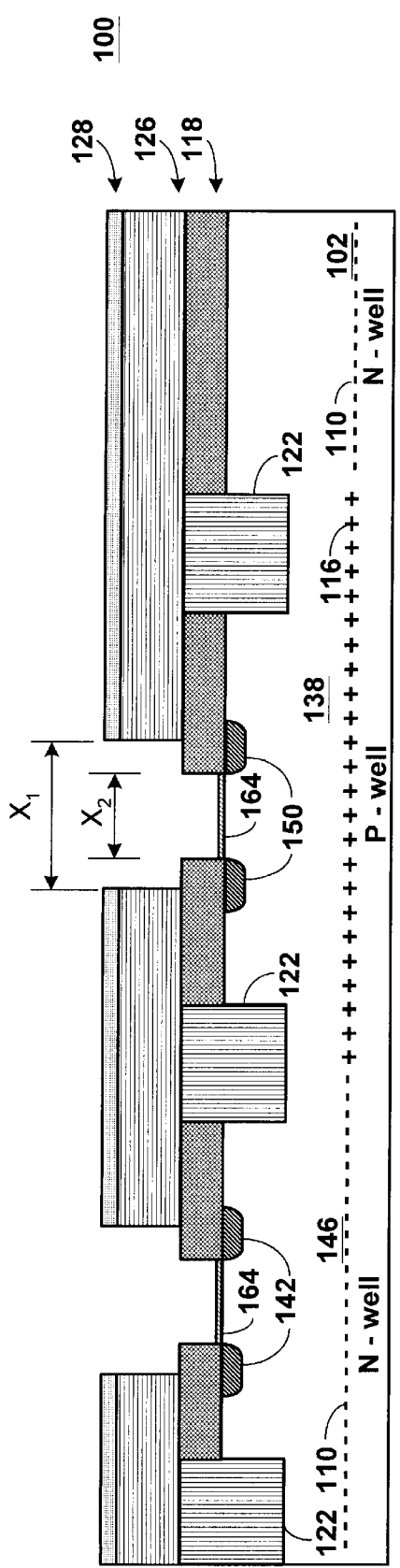
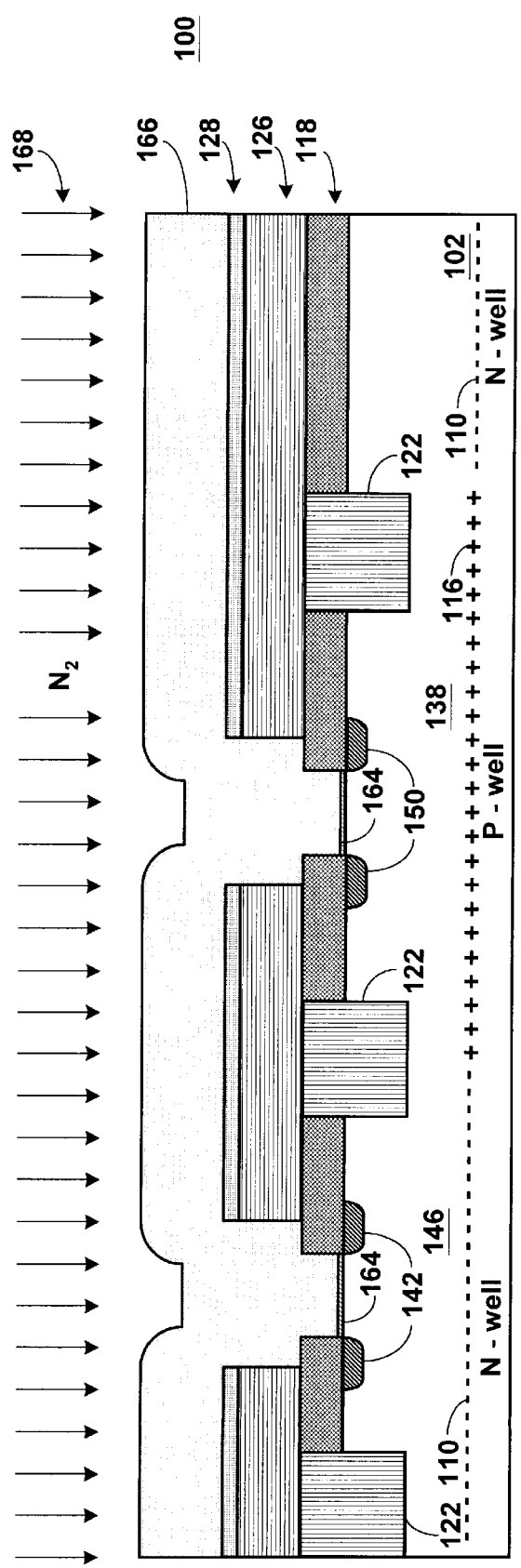
FIGURE 1AE
FIGURE 1AF

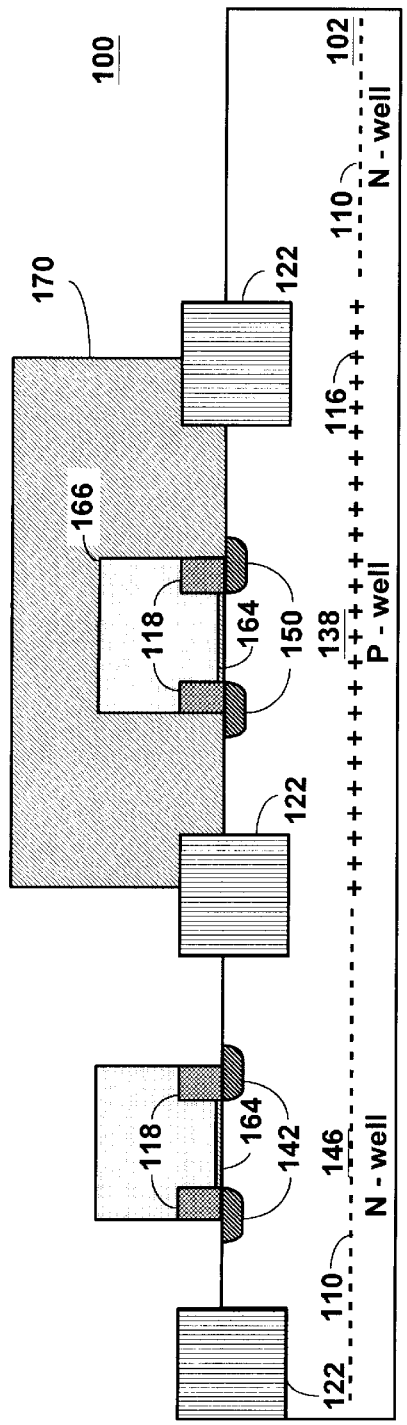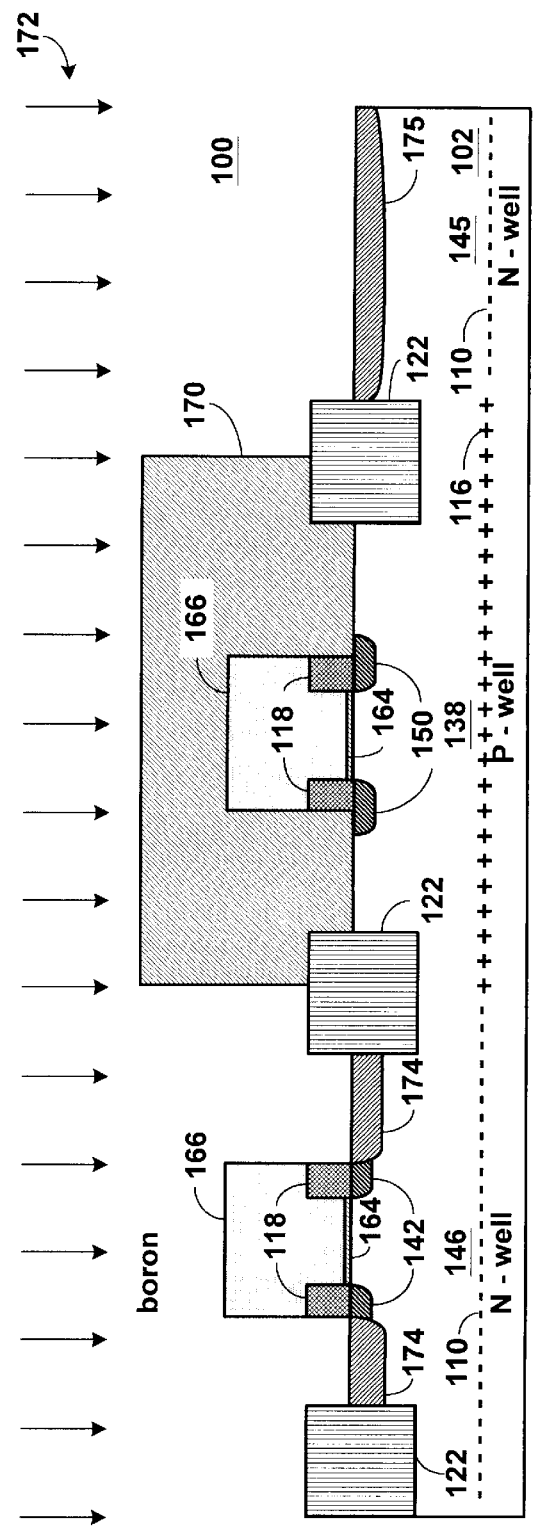

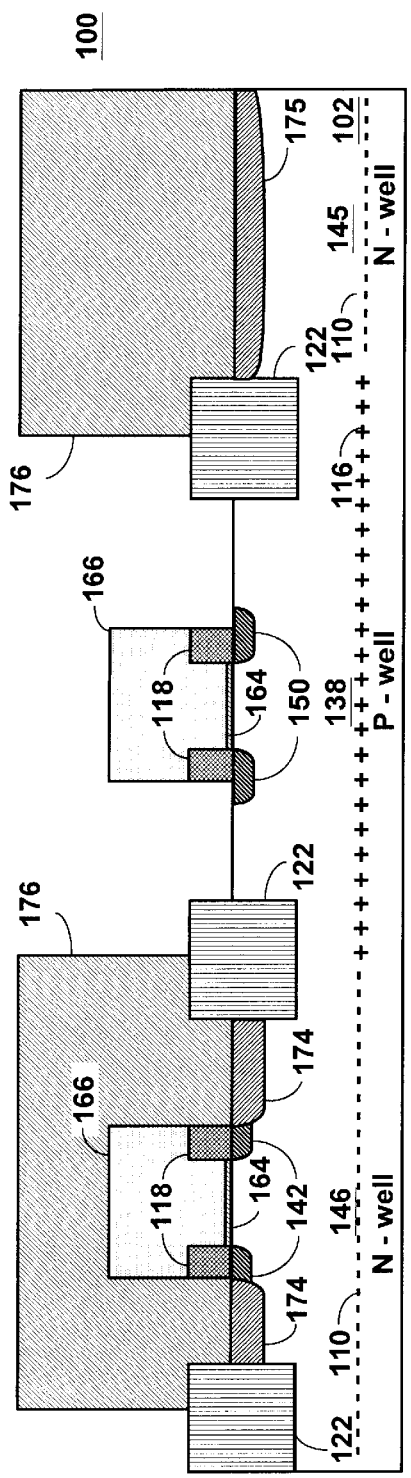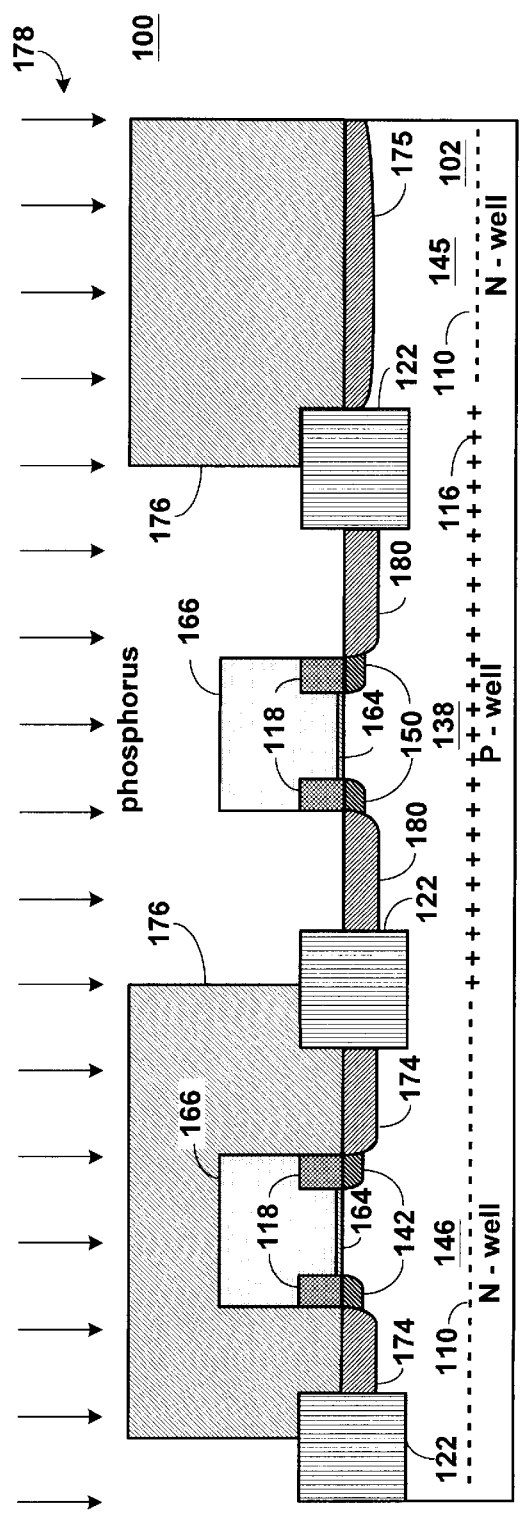

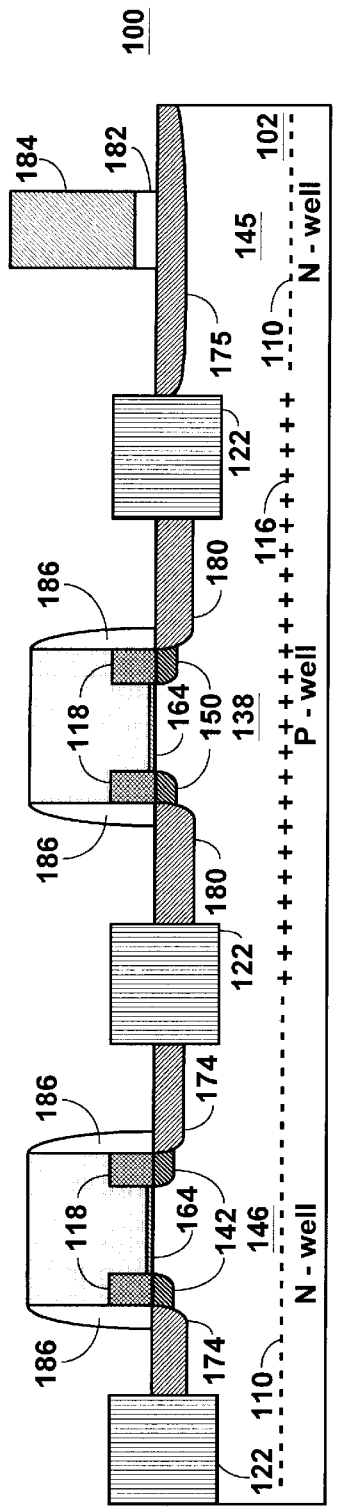
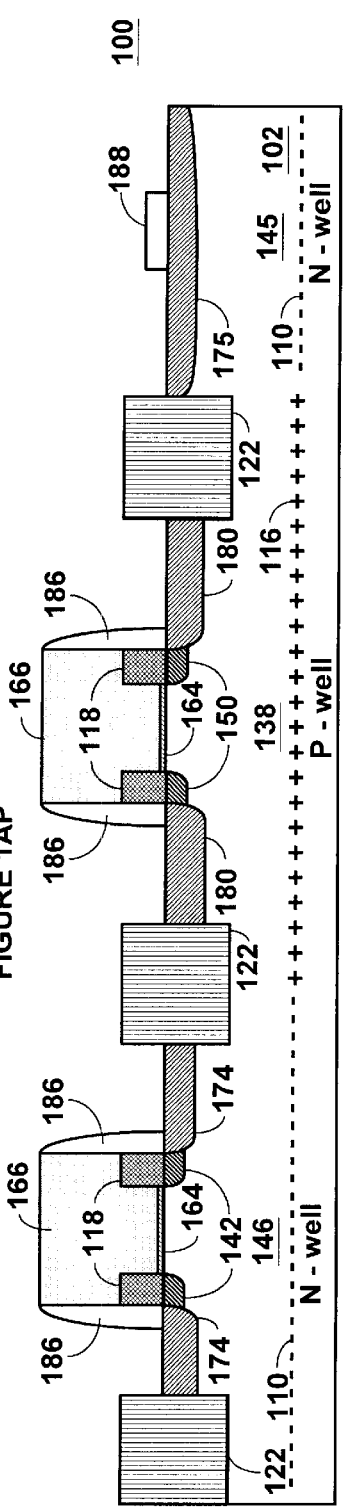
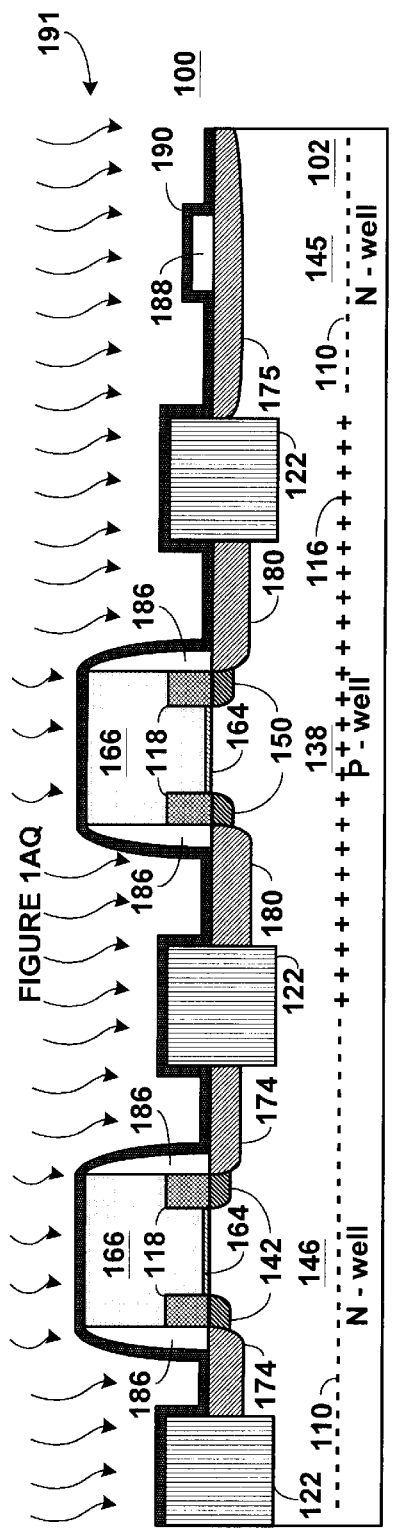
FIGURE 1AP
FIGURE 1AQ
FIGURE 1AR

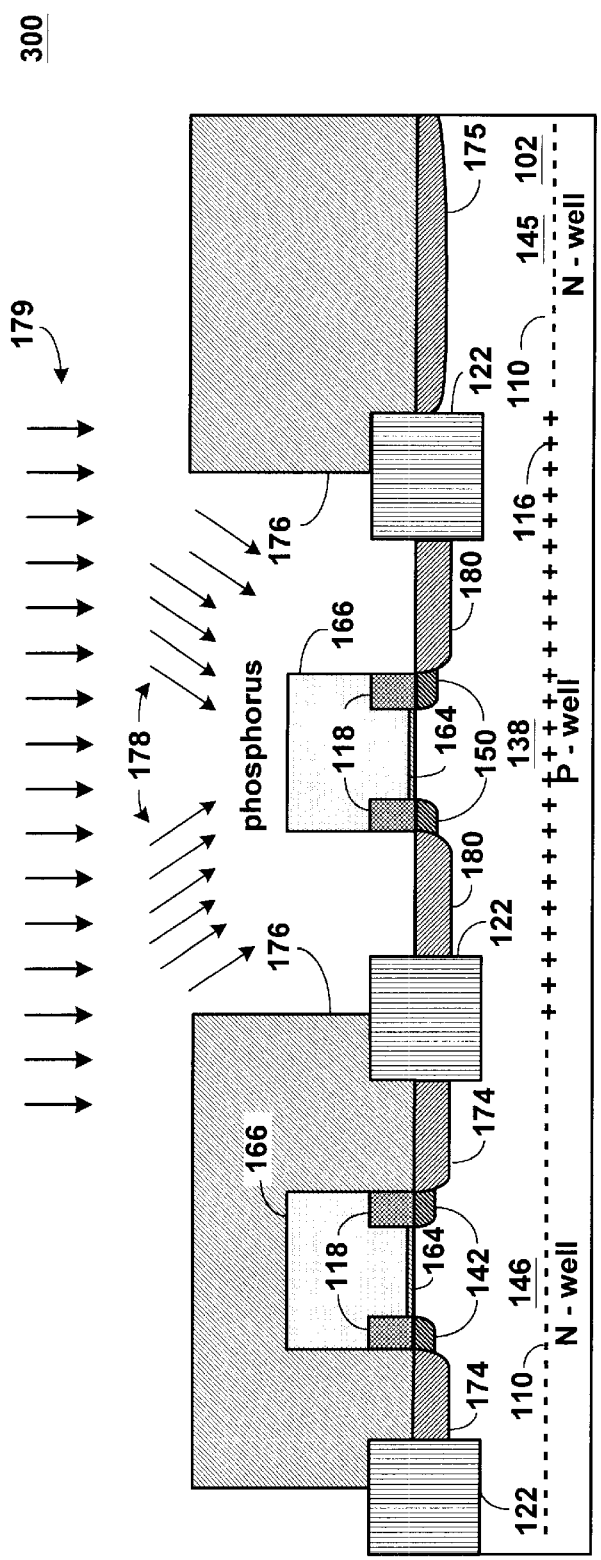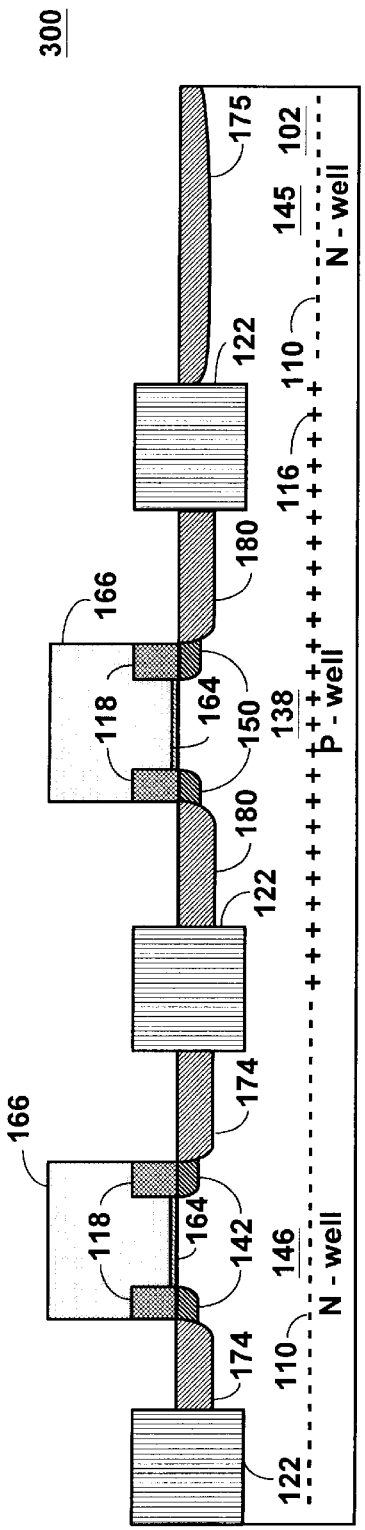
FIGURE 3B
FIGURE 3C

METHOD OF FORMING LOW RESISTANCE REDUCED CHANNEL LENGTH TRANSISTORS

BACKGROUND OF THE INVENTION

1. Field of the Invention

This invention relates generally to the manufacture of high performance semiconductor devices. More specifically, this invention relates to the manufacture of high performance semiconductor devices having reduced channel length transistors.

2. Discussion of the Related Art

In order to achieve higher operating frequencies and higher transconductance, a short gate channel length is necessary. Shortening the channel length inherently increases the switching speed of the transistor because charge carriers such as electrons have a shorter distance to travel between the source and drain of the transistor. Since the charge carriers travel a shorter distance, the charge carriers are able to complete the journey in a shorter period of time.

Typically a photolithography process is used to pattern the polysilicon gate. After a global deposition of a layer of polysilicon over the semi-processed substrate, a layer of photoresist is then coated over the polycrystalline silicon. The radiation (illumination) from a radiation source is used to transfer the patterns from a reticule onto the wafer. The radiation excites the photosensitive resins and subsequent processes remove the unexcited photoresist to form patterns on top of the polysilicon layer. A subtractive etch process then replicates the photoresist patterns to form polysilicon gates.

Because the demand for higher and higher speed devices is continuing, the requirement for smaller transistors has outstripped the ability of available illumination or radiation sources to reliably process the transistors in mass quantities with the requisite quality. Typically, a deep ultra-violet source having a wavelength of 250 nanometers or smaller is used for the quarter micron process. The minimum printable feature size is within the optical threshold of the deep ultra-violet illumination source. However, at these transistor dimensions, the speed generated is far less than that desired. The minimum requirement for leading edge microprocessors demands a gate length near or below that available from the next generation of radiation sources having a wavelength of approximately 193 nanometers and less. However, because this wavelength is in the region of x-ray radiation, and because x-ray radiation is difficult to control, more advanced techniques utilizing more conventional radiation sources are required to continue the downward scaling of transistor dimensions.

One advanced technique is to reduce the photoresist pattern prior to the etch process. As is known in the field of semiconductor manufacturing, an etch process inevitably leaves a positive (outward) sloped structural profile. This is caused by the phenomenon known as the aspect ratio etch dependency phenomenon in which polymer buildup on sidewalls of structures produce a structure that has a larger base. Since the switching of the transistor is accomplished at the base of the polysilicon (gate) structure, it is important that the base of the polysilicon gate is kept at a minimum. However, the performance gain from this technique is less than optimal for a given critical dimension.

Therefore, what is needed is a technique to exploit currently available radiation sources, materials and equipment that can be used in well understood processes to continue the downward scaling of transistor dimensions.

SUMMARY OF THE INVENTION

According to the present invention, the foregoing and other objects and advantages are achieved by forming spacers on each side of trenches that define transistor channels that are formed in a semiconductor substrate in the semiconductor device. The trenches are formed in a stack of materials including a layer of dielectric, a layer of a high K dielectric material and a layer of material that acts as a polish stop layer. The spacers are formed with a dimension between the spacers that is less than a dimension available from photolithography systems currently available. A layer of gate oxide and a polysilicon gate are formed within the dimension resulting in transistors having a channel length less than that available from standard photolithographic methods of forming gates and channels.

In accordance with an aspect of the invention, PLDD regions and NLDD regions are formed in the respective n-well regions and p-well regions. Standard sidewall spacers are formed on the polysilicon gates and source and drain regions are formed in the respective n-well regions and p-well regions.

In accordance with another aspect of the invention, a layer of an etch stop material is formed on the layer of dielectric before the layer of high K dielectric material, the layer of material formed on the layer of high K dielectric material.

In accordance with still another aspect of the invention, the PLDD regions and NLDD regions are formed in the respective n-well regions and p-well regions by implanting ions at an angle through a PLDD mask and an NLDD mask, respectively. Source and drain regions in the respective n-well regions and p-well regions are formed by implanting ions through the same PLDD mask and NLDD mask.

The present invention is better understood upon consideration of the detailed description below, in conjunction with the accompanying drawings. As will become readily apparent to those skilled in the art from the following description, there is shown and described embodiments of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of illustrative embodiments when read in conjunction with the accompanying drawings, wherein:

FIGS. 1A–1F illustrate a method of forming a portion of a semiconductor device having P-wells and N-wells;

FIGS. 1G–1J illustrate a method of forming a portion of a semiconductor device having shallow trench isolation (STI) structures;

FIGS. 1K–1L show the shallow trench isolation (STI) structures filled with an oxide and planarized;

FIGS. 1M–1P illustrate a method of forming a portion of a semiconductor device having a self-aligning gate hard mask;

FIGS. 1Q–1V illustrate a method of forming a portion of a semiconductor device having PLDD regions and NLDD regions;

FIGS. 1W–1AD illustrate a method of forming a portion of a semiconductor with defined gate channel lengths;

FIGS. 1AE–1AM illustrate a method of forming a portion of a semiconductor with a polysilicon gate and source and drain regions;

FIGS. 1AN–1AS illustrate a method of forming a portion of a semiconductor with an ESD resistor and salidation regions;

FIGS. 2A–2B illustrate an alternate embodiment of the present invention having an etch stop layer between the substrate and the layer of dielectric; and FIGS. 3A–3C illustrate a second alternate embodiment of the present invention showing high angle implants to form PLDD regions and NLDD regions. The method of forming PLDD regions and NLDD regions allow source/drain junctions to be formed using the same mask that form the PLDD regions and the NLDD regions.

DETAILED DESCRIPTION

Reference is now made in detail to a specific embodiment or specific embodiments of the present invention that illustrate the best mode or modes presently contemplated by the inventors for practicing the invention.

FIGS. 1A–1F illustrate a method of forming a portion 100 of a semiconductor device having P-wells and N-wells.

Figure 1A:
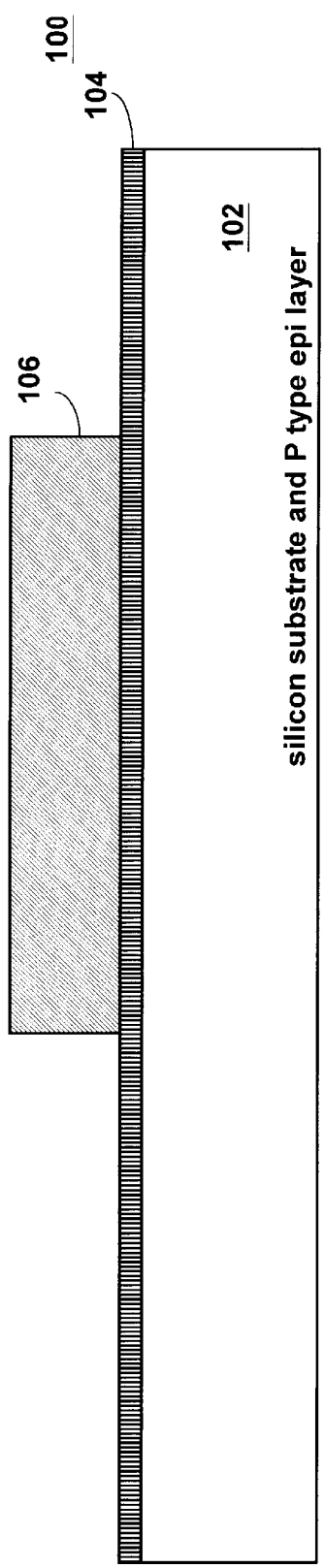

FIG. 1A shows the portion 100 of a semiconductor device having a P-type substrate 102. A layer 104 of barrier oxide is formed on the surface of the substrate 102. An N-well mask 106 is formed on the surface of the layer 104 of barrier oxide. As is known in the semiconductor manufacturing art, the N-well mask is formed by depositing a layer of photoresist on the surface of the layer 104 of barrier oxide, patterning the layer of photoresist, developing the layer of photoresist and removing portions of the layer of photoresist leaving the N-well mask 106.

Figure 1B:
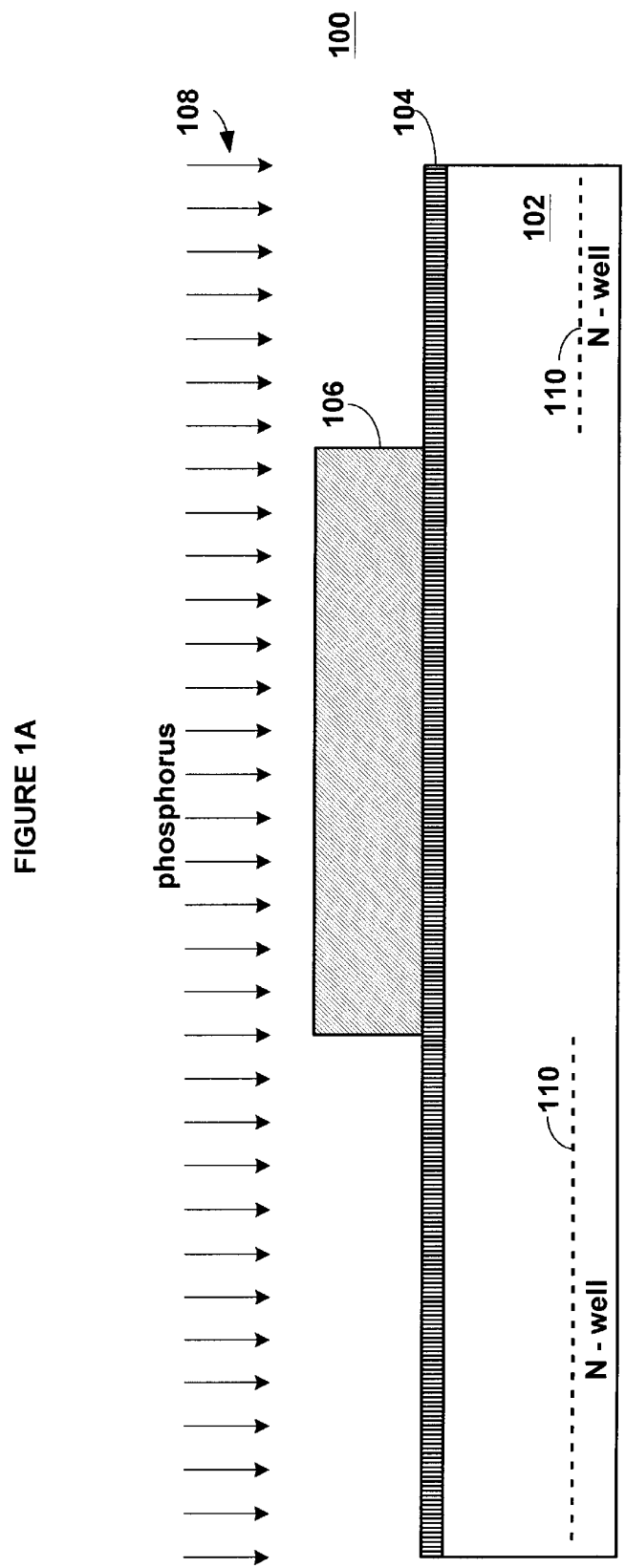

FIG. 1B shows the portion 100 of the semiconductor device as shown in FIG. 1A being implanted with N-type ions, such as phosphorus ions, indicated by arrows 108. The implanted phosphorus ions form N-well regions 110.

FIG. 1C shows the portion 100 of the semiconductor device as shown in FIG. 1B with the N-well mask 106 removed.

FIG. 1D shows the portion 100 of the semiconductor device as shown in FIG. 1C with a P-well mask 112 formed on the layer 104 of barrier oxide. As discussed above in conjunction with the discussion of the formation of the N-well mask 106, a layer of photoresist is formed on the layer 104 of barrier oxide, patterned, developed and portions removed to leave P-well mask 112.

FIG. 1E shows the portion 100 of the semiconductor device as shown in FIG. 1D being implanted with P-type ions, such as boron ions, indicated by arrows 114. The implanted boron ions form the P-well region 116.

FIG. 1F shows the portion 100 of the semiconductor device as shown in FIG. 1E with the P-well mask 112 and barrier layer 104 removed.

FIG. 1G shows the portion 100 of the semiconductor device as shown in FIG. 1F with a layer 118 of dielectric, preferably silicon nitride, formed on the substrate 102.

FIG. 1H shows the portion 100 of the semiconductor device as shown in FIG. 1G with a layer 119 of photoresist formed on the layer 118 of dielectric. The layer 120 of photoresist is patterned, developed and portions of the layer 120 of photoresist removed to form a shallow trench isolation mask 120 that exposes portions 121 of the layer 118 of dielectric.

Figure 1I:
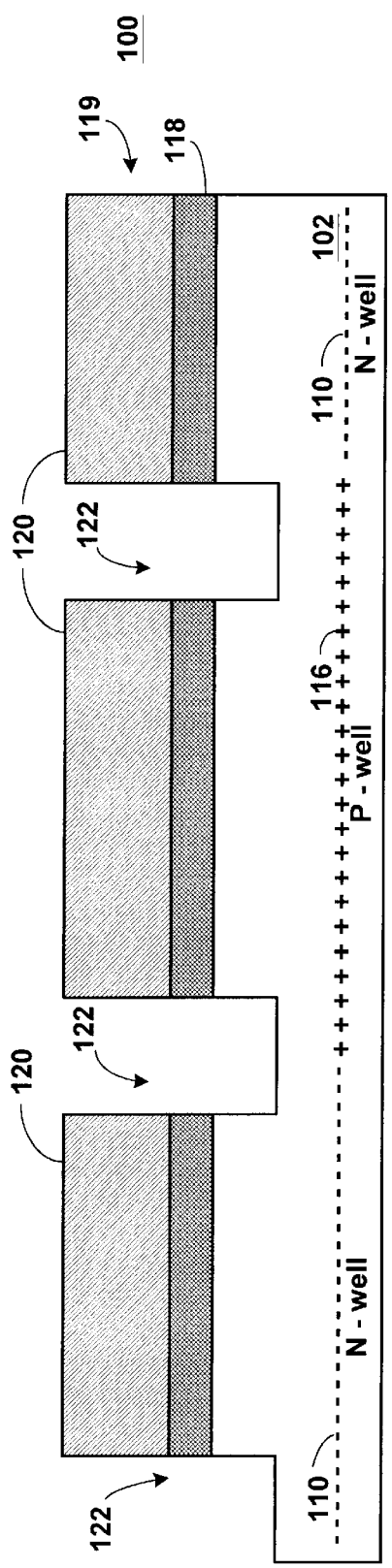

FIG. 1I shows the portion 100 of the semiconductor device as shown in FIG. 1H after an anisotropic etch process etches through the exposed portions 121 (FIG. 1H) of the layer 118 of dielectric exposing portions of the underlying substrate 102, which is in turn partially etched to form trenches 122.

Figure 1J:
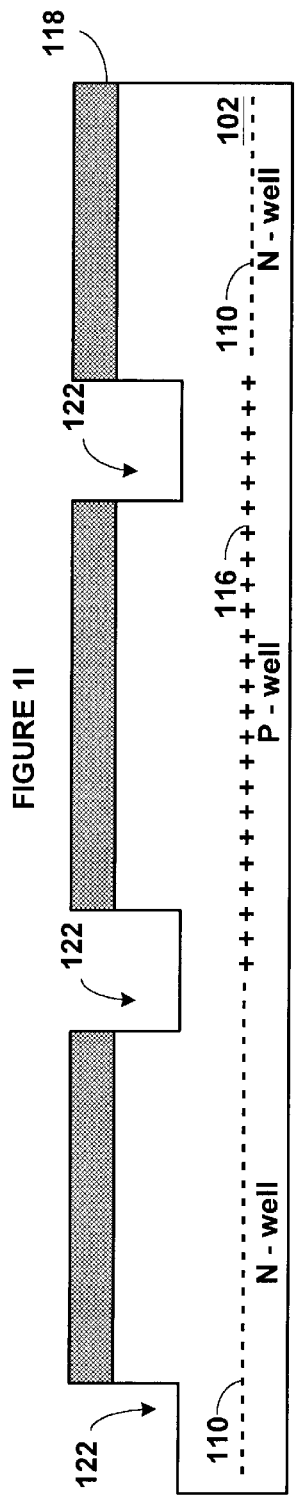

FIG. 1J shows the portion 100 of the semiconductor device as shown in FIG. 1I with the remaining portions of the layer 119 (FIG. 1I) of photoresist removed. A layer of liner oxide (not shown) can be grown on the walls of the trenches 122.

Figure 1K:
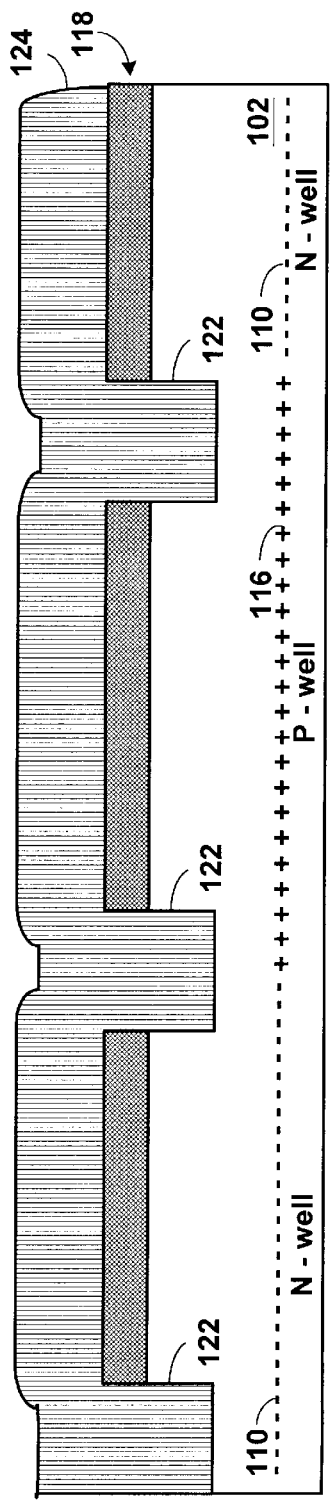

FIG. 1K shows the portion 100 of the semiconductor device as shown in FIG. 1J with a layer 124 of trench oxide formed on the surface of the wafer that fills the trenches 122. The trench oxide is typically a furnace oxide.

FIG. 1L shows the portion 100 of the semiconductor device as shown in FIG. 1K after a planarization process that planarizes the surface of the wafer and removes excess portions of the layer 124 of trench oxide. The planarization process is typically a chemical mechanical polishing (CMP) process that uses the top surface of the layer 118 of dielectric as a polish stop.

FIG. 1M shows the portion 100 of the semiconductor device as shown in FIG. 1L with a film stack consisting of a layer 126 and a layer 128 (optional) formed on the planarized surface of the wafer. Layer 126 is preferably a layer of a high K dielectric material, such as barium strontium titanate (BST), strontium bismuth tantalate (SBT), tantalum oxide ($Ta_2O_5$), and lead zirconate titanate (PZT). Layer 128 is preferably a nitride of titanium or tantalum and is used as a polish stop layer in a subsequent process.

FIG. 1N shows the portion 100 of the semiconductor device as shown in FIG. 1M with a layer 130 of photoresist formed on the layer 128. The layer 130 of photoresist is patterned with a gate mask pattern, developed and portions removed to form openings 132 in the layer 130 of photoresist. The openings 132 expose portions 134 of the layer 128.

Figure 1O:
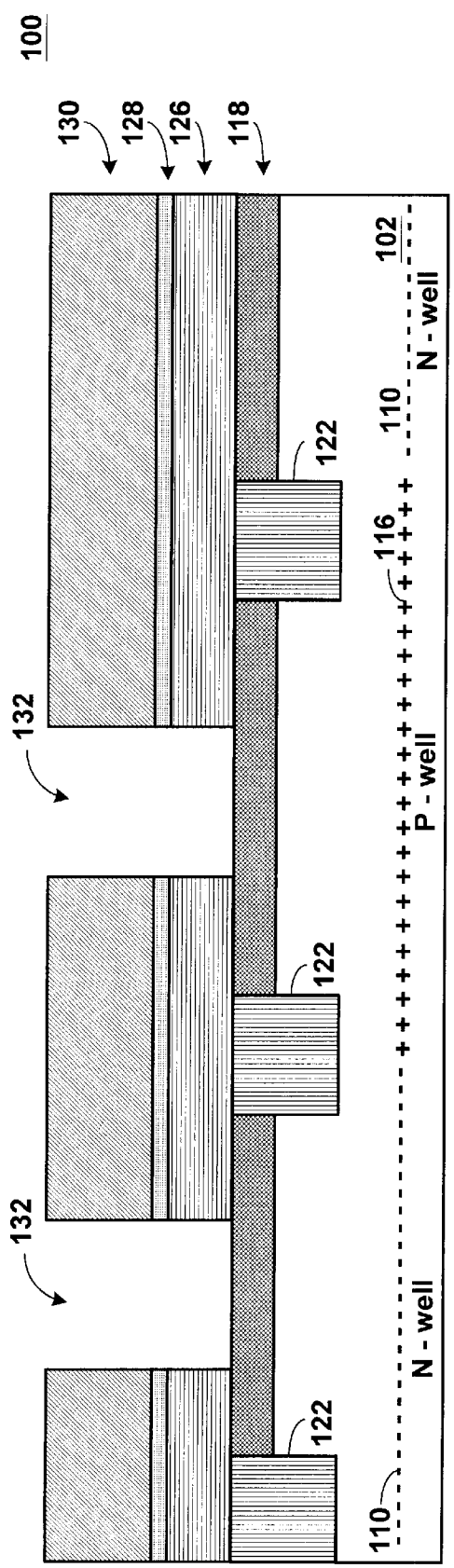

FIG. 1O shows the portion 100 of the semiconductor device as shown in FIG. 1N after an anisotropic etch process removes the exposed portions 134 (FIG. 1N) of the layer 128 exposing portions of the layer 126 that are etched down to the layer 118 of dielectric. The materials selected for layers 128, 126, and 118 provide etch selectivity and thus layers 126 and 118 act as etch stop layers during subsequent etch processes.

Figure 1P:
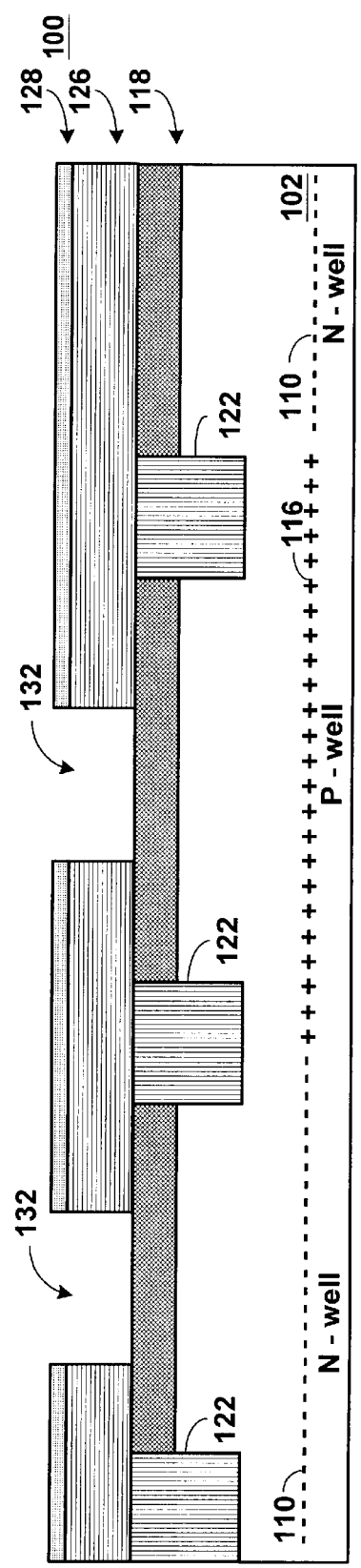
Figure 1A:
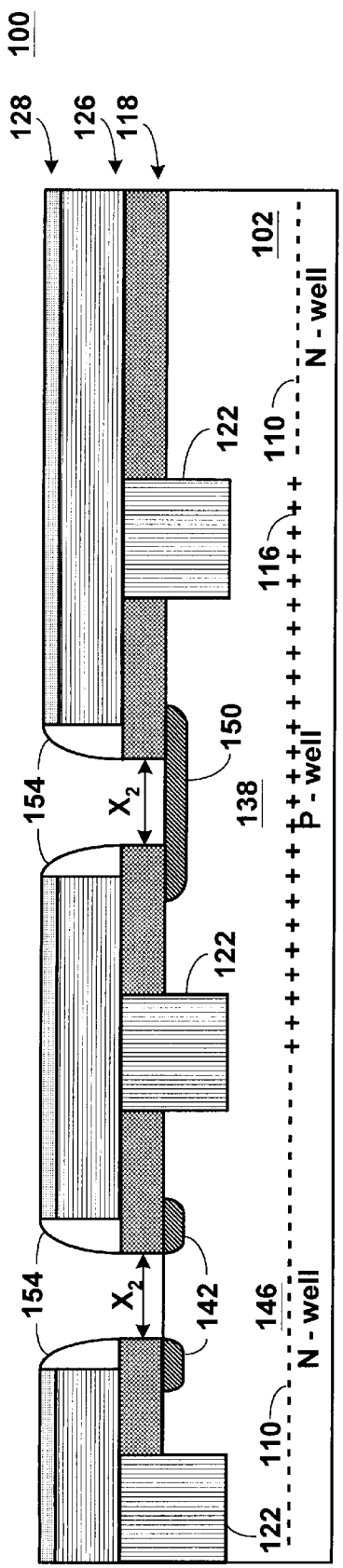
Figure 1A:
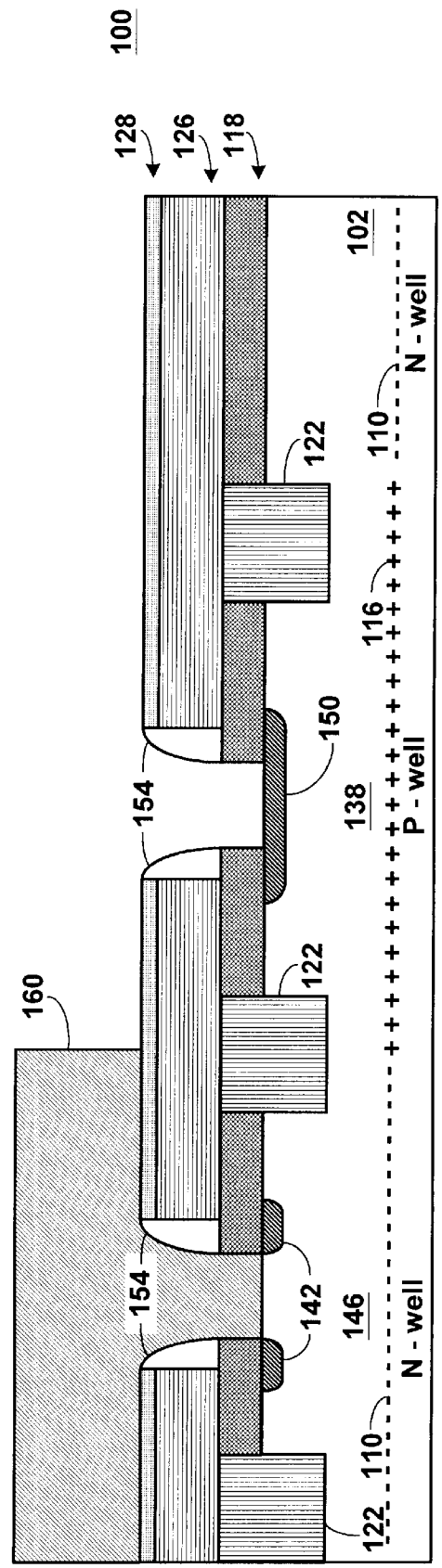
Figure 1A:
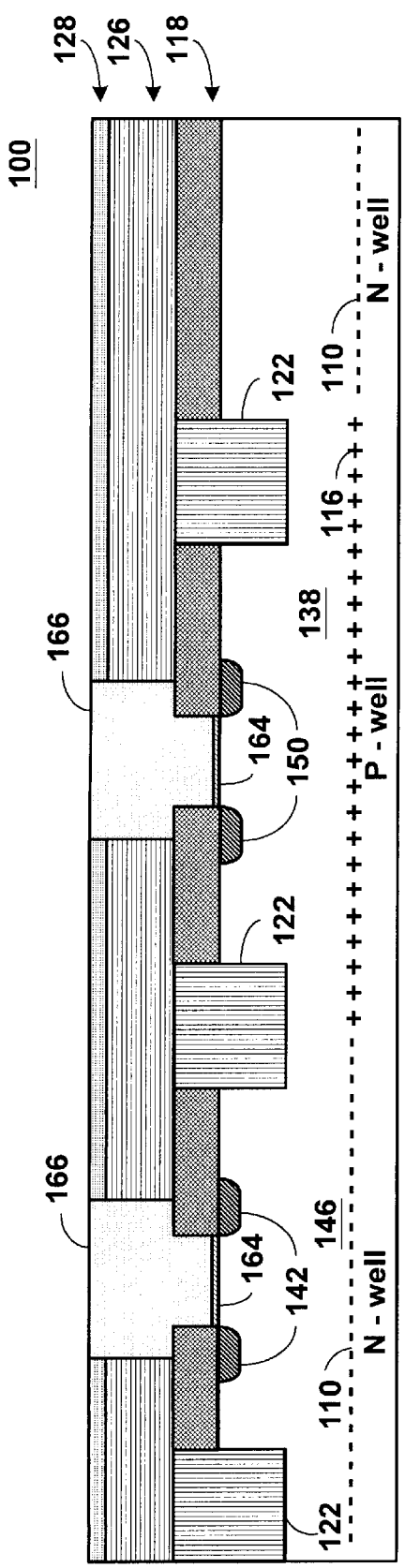
Figure 1A:
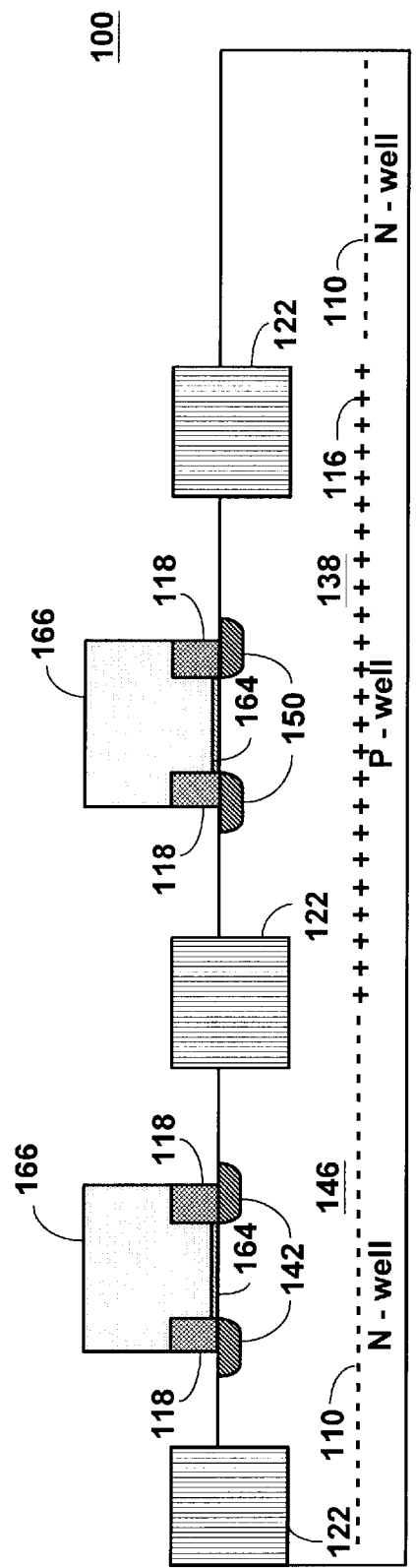
Figure 1A:
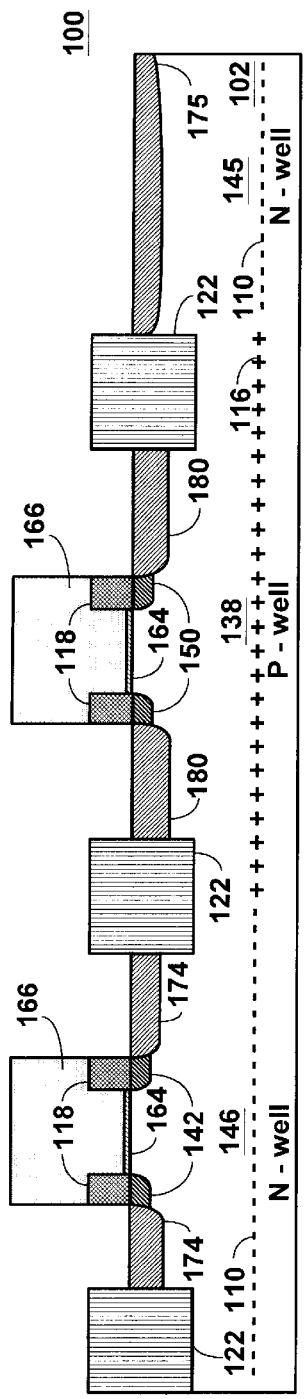
Figure 1A:
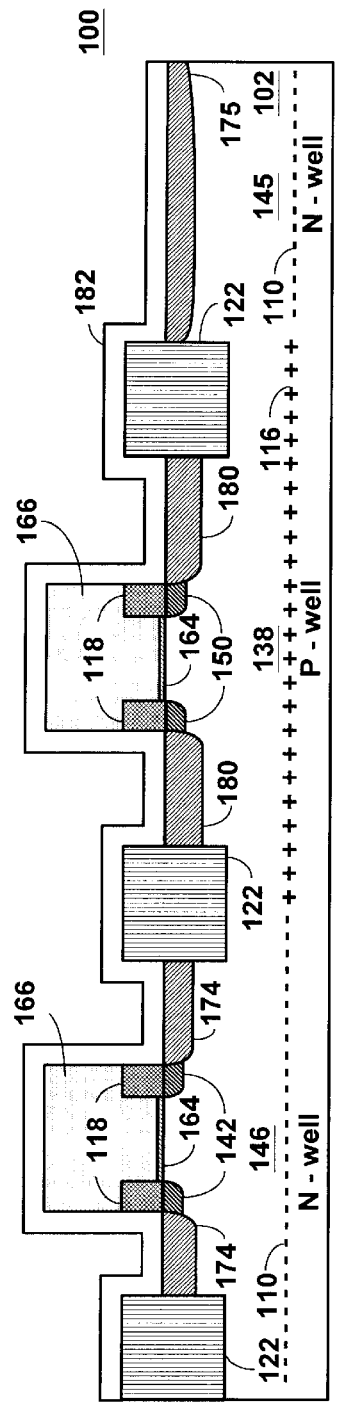
Figure 1A:
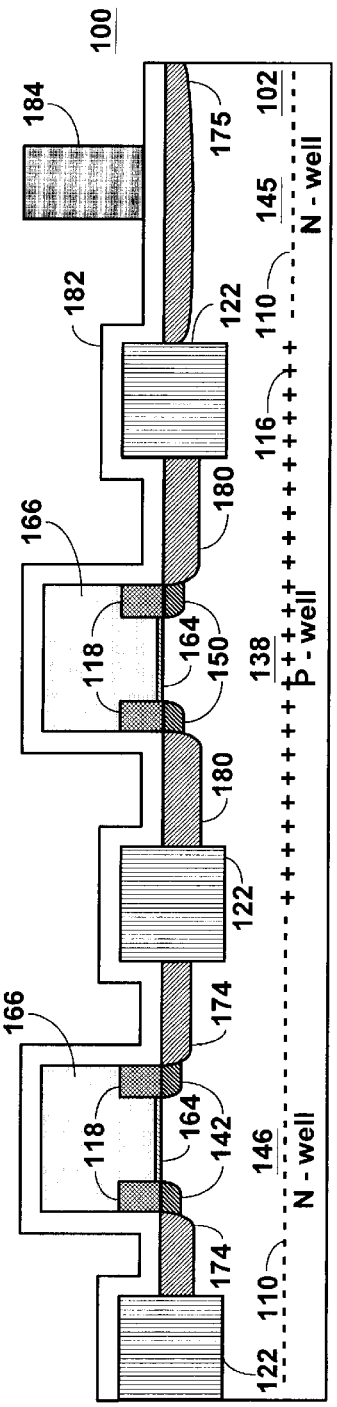
Figure 1A:
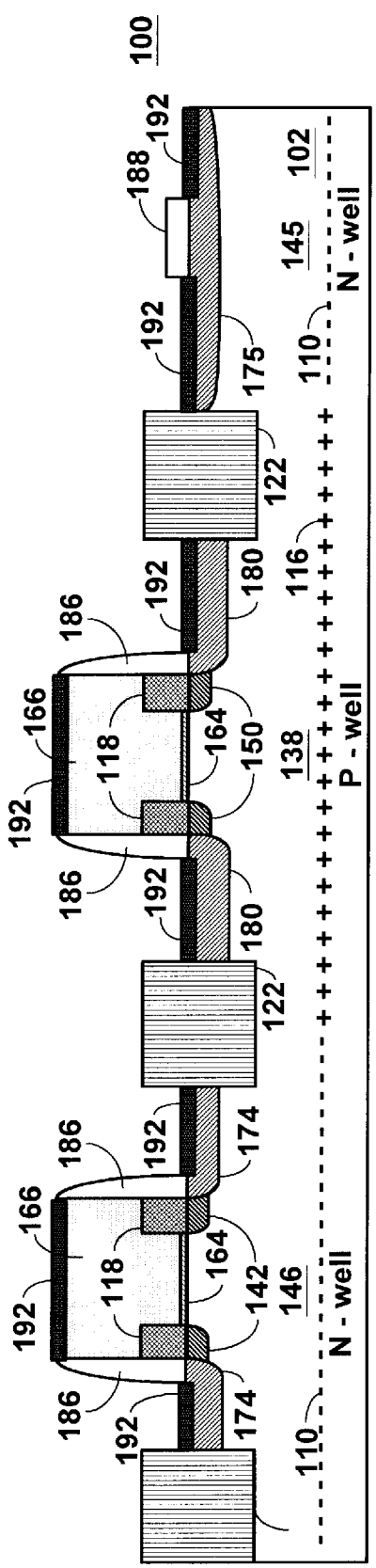

FIG. 1P shows the portion 100 of the semiconductor device as shown in FIG. 1O with the remaining portions of the layer 130 of photoresist removed.

FIG. 1Q shows the portion 100 of the semiconductor device as shown in FIG. 1P with a PLDD mask 136 formed over the n-channel transistor region 138.

FIG. 1R shows the portion 100 of the semiconductor device as shown in FIG. 1Q being implanted with P-type ions, such as $BF_2$ ions indicated by arrows 140, forming the PLDD region 142.

FIG. 1S shows the portion 100 of the semiconductor device as shown in FIG. 1R with the PLDD mask 136 removed.

FIG. 1T shows the portion 100 of the semiconductor device as shown in FIG. 1S with an NLDD mask 144 formed over the p-channel transistor region 146.

FIG. 1U shows the portion 100 of the semiconductor device as shown in FIG. 1T being implanted with N-type ions, such as arsenic ions indicated by arrows 148, forming an NLDD region 150.

FIG. 1V shows the portion 100 of the semiconductor device as shown in FIG. 1U with the NLDD mask 144 removed.

FIG. 1W shows the portion 100 of the semiconductor device as shown in FIG. 1V with a layer 152 of spacer oxide deposited conformably to the surface of the semiconductor device.

FIG. 1X shows the portion 100 of the semiconductor device as shown in FIG. 1W after a series of anisotropic etches that etches through portions of layer 152 (FIG. 1W) of spacer oxide down to the surface of the PLDD region 142 and to the surface of NLDD region 150 and forming spacers 154. The size of the spacers 154 determines the length $X_2$ of the gate channel. The size of the spacers and the location of the spacers are adjusted so that the opening between the spacers is selectable and can be less than an opening available from standard photolithography systems. Because the channel is exposed, it can be easily measured and adjusted to a desirable target dimension. For example, additional etches can be used to increase the separation between the spacers 154, which adjusts the channel length $X_2$ by allowing an anisotropically etch that etches additional portions of the layer 118 of dielectric.

FIG. 1Y shows the portion 100 of the semiconductor device as shown in FIG. 1X with a punchthrough mask 156 formed over region 138.

FIG. 1Z shows the portion 100 of the semiconductor device as shown in FIG. 1Y being implanted with phosphorus ions as indicated by arrows 158, which separate the PLDD region 142.

FIG. 1AA shows the portion 100 of the semiconductor device as shown in FIG. 1Z with the punchthrough mask 156 removed and showing the PLDD regions 142 having been defined.

FIG. 1AB shows the portion 100 of the semiconductor device as shown in FIG. 1AA with a punchthrough mask 160 formed over region 146.

FIG. 1AC shows the portion 100 of the semiconductor device as shown in FIG. 1AB being implanted with P-type ions as indicated by arrows 162 which separate the NLDD regions 150.

FIG. 1AD shows the portion 100 of the semiconductor device as shown in FIG. 1AC with the punchthrough mask 160 removed and showing the relationship between dimension $X_1$ and dimension $X_2$. The $X_1$ dimension represents the minimum dimension available from the conventional method of forming channels that would not have a dimension less than $X_1$. However, by using the spacers 154 in accordance with the present invention a dimension less than $X_1$, i.e., a dimension of $X_2$ is achievable.

FIG. 1AE shows the portion 100 of the semiconductor device as shown in FIG. 1AD with a layer 164 of gate oxide grown on exposed surfaces of the substrate 102. In addition, the spacers 154 (FIG. 1AD) have been removed.

FIG. 1AF shows the portion 100 of the semiconductor device as shown in FIG. 1AE with a conformal layer 166 of polysilicon deposited on the surface of the semiconductor device 100. Nitrogen ions, indicated by arrows 168 are implanted into the polysilicon to retard the diffusion of boron into the polysilicon gates that will be formed. The implanted nitrogen reduces the polysilicon depletion of p-channel devices.

FIG. 1AG shows the portion 100 of the semiconductor device as shown in FIG. 1AF with the layer 166 of polysilicon planarized down to the surface of layer 128, which acts as a polish stop. The planarization process is typically a chemical mechanical polishing (CMP) process.

FIG. 1AH shows the portion 100 of the semiconductor device as shown in FIG. 1AG after a series of anisotropic etch processes removes the remaining portions of the layer 128, the remaining portions of the layer 126 and the remaining portions of the layer 118 which are unprotected by the polysilicon gates 166. The polysilicon gates 166 act as a self-aligning structure to etch away the unprotected regions. The remaining portions of layer 118 act as in-situ spacers, which are used to reduce the diffusion of the LDD ions towards the edges of the gate electrode and thus reduce the parasitic capacitance of the device. Another advantage is that the in-situ spacers reduce the length of the bottom of the gate to a dimension less than that achievable using a standard lithographic method. In addition, because the bottom of the gate is less than that achievable using a standard lithographic method, it is necessary that the top of the gate is at least the minimum size achievable using a standard lithographic method so that the gate contact can be accurately positioned over the gate. As can be appreciated, if the entire gate was a size less than the minimum size, the interconnection could bridge the gate and interconnect with either the drain or source, or in extreme cases interconnect the drain and source as well as the gate.

FIG. 1AI shows the portion 100 of the semiconductor device as shown in FIG. 1AH with a mask 170 formed over the P-well region 138.

FIG. 1AJ shows the portion 100 of the semiconductor device as shown in FIG. 1AI being implanted with boron ions as indicated by arrows 172 and the source/drain regions 174 that are formed in the substrate 102 by the boron implant and a heavy implant region 175 in an ESD region 145 in the substrate 102.

FIG. 1AK shows the portion 100 of the semiconductor device as shown in FIG. 1AJ with the mask 170 removed and a mask 176 formed over the N-well region 146 and over ESD region 145.

FIG. 1AL shows the portion 100 of the semiconductor device as shown in FIG. 1AK being implanted with phosphorus ions indicated by arrows 178 and the source/drain regions 180 formed in region 138 of the substrate 102 by the phosphorus implant.

FIG. 1AM shows the portion 100 of the semiconductor device as shown in FIG. 1AL with the mask 176 removed.

FIG. 1AN shows the portion 100 of the semiconductor device as shown in FIG. 1AM with a conformal layer 182 of CVD (chemical vapor deposited) dielectric formed on the surface of the semiconductor device 100.

FIG. 1AO shows the portion 100 of the semiconductor device as shown in FIG. 1AN with a photoresist mask 184 formed over ESD region 145.

FIG. 1AP shows the portion 100 of the semiconductor device as shown in FIG. 1AO after an anisotropic etch process etches layer 182 of CVD oxide to form sidewall spacers 186 on the sides of gates 166 and etches remaining portions of the layer 182 of CVD oxide except the portion protected by the ESD photoresist mask 184.

FIG. 1AQ shows the portion 100 of the semiconductor device as shown in FIG. 1AP with the remaining portion of the ESD photoresist mask 184 removed leaving ESD resistor 188.

FIG. 1AR shows the portion 100 of the semiconductor device as shown in FIG. 1AQ with a conformal layer 190 of metal formed on the surface of the semiconductor device 100. The metal that is appropriate for use includes titanium, cobalt, nickel and platinum. A thermal process such as an RTA (rapid thermal anneal) indicated by wavy arrows 191 causes free silicon atoms to react with the metal to form a metal compound.

FIG. 1AS shows the portion 100 of the semiconductor device as shown in FIG. 1AR after the portions of the layer 190 of metal that have not formed a metal compound are removed from the portion 100 of the semiconductor device. The metal can be removed by any of several well-known methods. Since the metal compound 192 does not form on an oxide, the metal compound only forms on surfaces that are not oxide. Therefore, the metal compound 192 is self-aligned to the top of the polysilicon gates 166, source and drain regions 174 & 180 and on the surface of the regions 174 adjacent to the resistor 188.

Figure 2A:
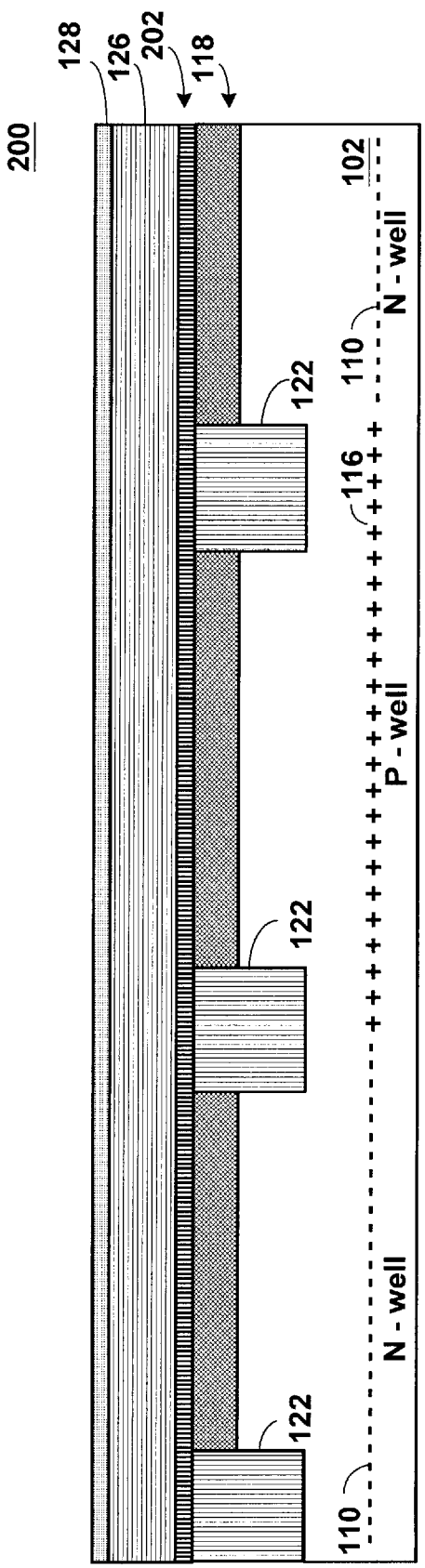
Figures 2B, 3A:
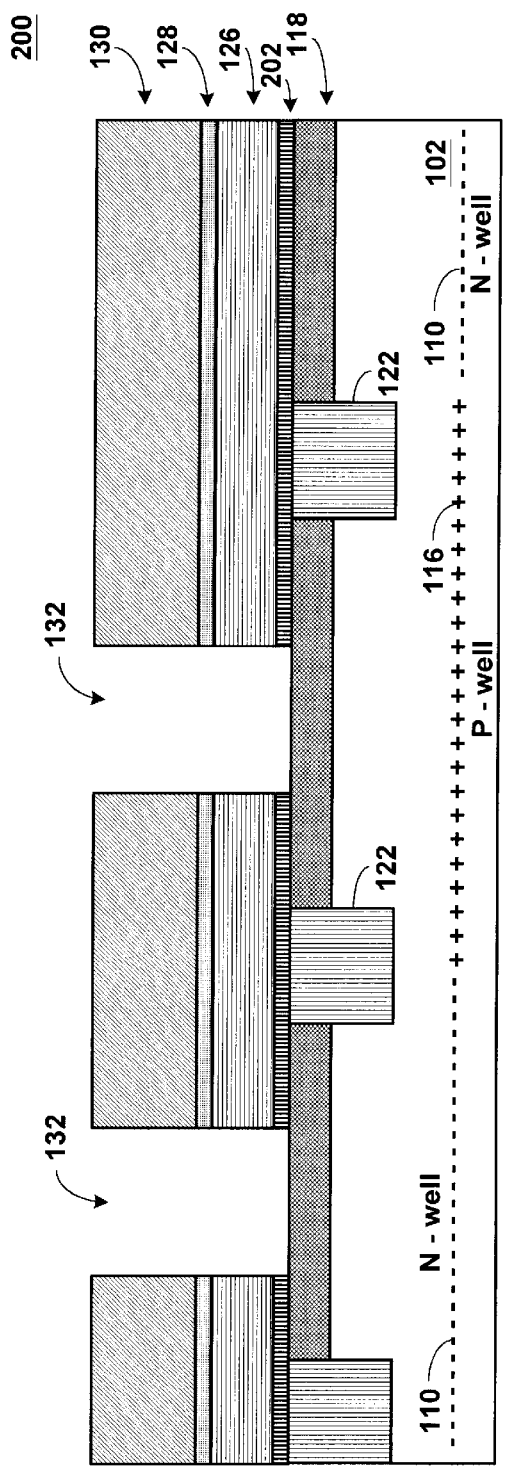

FIGS. 2A & 2B illustrate a second embodiment of the present invention. FIG. 2A shows the portion 200 of the semiconductor device as shown in FIG. 1L where silicon nitride, oxide or nitride is used instead of the high K dielectric material for layer 126. A thin layer 202 of etch stop material is formed on the planarized surface of the layer 118 and isolation structures 122. The film stack consisting of layer 126 and layer 128 is formed on the layer 200. Layer 128 is preferably a nitride of titanium or tantalum.

FIG. 2B shows the portion 200 of the semiconductor device as shown in FIG. 2A after a layer of photoresist 130 has been deposited, patterned and developed and after anisotropic etch processes has etched layers 128, 126, and 202 forming openings 132. Processing of the semiconductor device then proceeds as shown in FIGS. 1O–1AS.

FIGS. 3A–3C illustrate a third embodiment of the present invention.

FIG. 3A shows a portion 300 of the semiconductor device after the steps shown in FIGS. 1A–1P, 1W–X, 1AE–AH have been completed being implanted with boron ions at an angle as indicated by arrows 172. The implantation of ions at a selected angle indicated by the arrows 172 form the PLDD regions 142. The formation of the PLDD regions 142 by implanting at an angle allows the formation of source/drain regions 174 using the same mask 170. The formation of the source/drain regions 174 can be achieved by implanting boron ions at high energy, indicated by arrows 173. In addition, an implant region 175 is formed in the ESD region 145.

FIG. 3B shows the portion 300 of the semiconductor device as shown in FIG. 3A after the mask 170 has been removed and a new mask 176 formed on the semiconductor device. The semiconductor device is shown being implanted with phosphorus ions at an angle, indicated by arrows 178 to form NLDD region 150. Also shown, the source and drain regions 180 can be formed using the same mask 176 by implanting ions as indicated by arrows 179. The formation of the source and drain regions in the P-well region can be by the implantation of heavy n-type ions such as arsenic ions.

As can be appreciated, the third embodiment saves two masking steps and provides an increase in throughput and a savings in cost.

FIG. 3C shows the portion 300 of the semiconductor device as shown in FIG. 3B after the mask 176 has been removed. The portion 300 of the semiconductor device is then finished processing.

The benefit of the above techniques is that the gate formed defined by the lower surface of the gate conductor is shorter than otherwise obtainable by available lithography techniques.

The foregoing description of the embodiments of the invention has been presented for purposes of illustration and description. It is not intended to be exhaustive or to limit the invention to the precise form disclosed. Obvious modifications or variations are possible in light of the above teachings. The embodiments were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of manufacturing a semiconductor device having low resistance reduced channel length transistors, the method comprising:

(a) forming n-well regions and p-well regions in a semiconductor substrate;

(b) forming isolation structures separating the n-well regions from the p-well regions forming exposed portions of the semiconductor substrate over the n-well regions and over the p-well regions;

(c) forming a layer of dielectric on the exposed portions of the semiconductor substrate forming a surface of dielectric including the portions of dielectric and top surfaces of the isolation structures;

(d) forming a layer of a high K dielectric material on the surface of the layer of dielectric, wherein the layer of high K dielectric material is selected from the group including barium strontium titanate (BST), strontium bismuth tantalate (SBT), tantalum oxide ($Ta_2O_5$), and lead zirconate titanate (PZT);

(e) forming a layer of a material on the layer of the high K dielectric, wherein the layer of material is selected from the group including a nitride of titanium and a nitride of tantalum;

(f) forming trenches having a width $X_1$ in the layer of material and the layer of high K dielectric material over selected n-well regions and selected p-well regions;

(g) forming PLDD regions in the n-well regions;

(h) forming NLDD in the p-well regions; and (i) forming spacers on sidewalls of the trenches and on portions of the layer of dielectric, wherein the spacers are formed on the portions of the sidewalls made up of the layer of high K dielectric material and the layer of material formed on the layer of high K dielectric material, and wherein the spacers the spacers are separated by a distance $X_2$, wherein $X_2$ is less than $X_1$ and the distance $X_2$ determines the length of a gate channel.

2. The method of claim 1 further comprising:

(j) anisotropically etching exposed portions of the layer of dielectric exposing portions of the semiconductor substrate in which PLDD regions and NLDD regions have been formed;

(k) removing the spacers;

(l) growing gate oxide on the exposed portions of the semiconductor substrate;

(m) depositing a conformal layer of polysilicon filling the trenches forming polysilicon gates;

(n) removing excess portions of the conformal layer of polysilicon down to the surface of the layer of material;

(o) anisotropically etching portions of the layer of material, the layer of high K dielectric material and the layer of dielectric not protected by the polysilicon gates, wherein remaining portions of the layer of dielectric forms in-situ spacers, which reduce parasitic capacitance of the device; and (p) forming source and drain regions in the n-well regions and p-well regions.

3. The method of claim 2 further comprising:

(q) forming sidewall spacers on sides of the polysilicon gates; and (r) forming ESD resistors over selected portions of the semiconductor substrate.

4. The method of claim 3 further comprising:

(s) globally depositing a layer of a metal selected from the group including titanium, cobalt, nickel, and platinum on the semiconductor device;

(t) subjecting the semiconductor device to a thermal process, wherein portions of the layer of metal overlying silicon and polysilicon react with the silicon and polysilicon to form a metal compound.

5. A method of manufacturing a semiconductor device having low resistance reduced channel length transistors, the method comprising:

(a) forming n-well regions and p-well regions in a semiconductor substrate;

(b) forming isolation structures separating the n-well regions from the p-well regions forming exposed portions of the semiconductor substrate over the n-well regions and over the p-well regions;

(c) forming a layer of dielectric on the exposed portions of the semiconductor substrate forming a surface of dielectric including the portions of dielectric and top surfaces of the isolation structures;

(d) forming a layer of an etch stop material on the surface of the layer of dielectric;

(e) forming a first layer of a material on the layer of an etch stop material, wherein the first layer of a material is selected from the group including silicon nitride, oxide and nitride;

(f) forming a second layer of a material on the first layer of a material, wherein the second layer of material is selected from the group including a nitride of titanium and a nitride of tantalum;

(g) forming trenches having a width $X_1$ in the first layer of material and the second layer of material exposing portions of the layer of etch stop material over selected n-well regions and selected p-well regions;

(h) removing the exposed portions of the layer of etch stop material;

(i) forming PLDD regions in the n-well regions;

(j) forming NLDD regions in the p-well regions; and (k) forming spacers on sidewalls of the trenches and on portions of the layer of dielectric, wherein the spacers are formed on the portions of the sidewalls made up of the first layer of material, the second layer of material and the layer of etch stop material, and wherein the spacers are separated by a distance $X_2$, wherein $X_2$ is less than $X_1$ the distance $X_2$ determines the length of a gate channel.

6. The method of claim 5 further comprising:

(l) anisotropically etching exposed portions of the layer of dielectric exposing portions of the semiconductor substrate in which PLDD regions and NLDD regions have been formed;

(m) removing the spacers;

(n) growing gate oxide on the exposed portions of the semiconductor substrate;

(o) depositing a conformal layer of polysilicon that fills the trenches forming polysilicon gates;

(p) removing excess portions of the conformal layer of polysilicon down to the surface of the layer of material;

(q) anisotropically etching portions of the first layer of material, the second layer of material and the layer of etch stop material not protected by the polysilicon gates; and (r) forming source and drain regions in the n-well regions and the p-well regions.

7. The method of claim 6 further comprising:

(s) forming sidewall spacers on sides of the polysilicon gates; and (t) forming ESD resistors over selected portions of the semiconductor substrate.

8. The method of claim 7 further comprising:

(u) globally depositing a layer of a metal selected from the group including titanium, cobalt, nickel, and platinum on the semiconductor device;

(v) subjecting the semiconductor device to a thermal process, wherein portions of the layer of metal overlying silicon and polysilicon react with the silicon and polysilicon to form a metal compound.

9. A method of manufacturing a semiconductor device having low resistance reduced channel length transistors, the method comprising:

(a) forming n-well regions and p-well regions in a semiconductor substrate;

(b) forming isolation structures separating the n-well regions from the p-well regions forming exposed portions of the semiconductor substrate over the n-well regions and over the p-well regions;

(c) forming a layer of dielectric on the exposed portions of the semiconductor substrate forming a surface of dielectric including the portions of dielectric and top surfaces of the isolation structures;

(d) forming a layer of a high K dielectric material on the surface of the layer of dielectric, wherein the layer of high K dielectric material is selected from the group including barium strontium titanate (BST), strontium bismuth tantalate (SBT), tantalum oxide ($Ta_2O_5$), and lead zirconate titanate (PZT);

(e) forming a layer of a material on the layer of the high K dielectric, wherein the layer of material is selected from the group including a nitride of titanium and a nitride of tantalum;

(f) forming trenches having a width $X_1$ in the layer of material and the layer of high K dielectric over selected n-well regions and selected p-well regions;

(g) forming spacers on sidewalls of the trenches and on portions of the layer of dielectric, wherein the spacers are formed on the portions of the sidewalls made up of the layer of high K dielectric material and the layer of material formed on the layer of high K dielectric material, and wherein the spacers are separated by a distance $X_2$ wherein $X_2$ is less than $X_1$ and the distance $X_2$ determines the length of a gate channel;

(h) anisotropically etching exposed portions of the layer of dielectric between said spacers, thereby exposing portions of the semiconductor substrate;

(i) removing the spacers;

(j) growing gate oxide on the exposed portions of the semiconductor substrate;

(k) depositing a conformal layer of polysilicon that fills the trenches forming polysilicon gates;

(l) removing excess portions of the conformal layer of polysilicon down to the surface of the layer of material;

(m) anisotropically etching portions of the layer of material, the layer of high K dielectric and the layer of dielectric not protected by the polysilicon gate;

(n) forming an n-well implant mask;

(o) forming PLDD regions in the n-well regions, wherein the PLDD regions in the n-well regions are implanted with p-type ions at a selected angle using the n-well implant mask; and (p) forming source and drain junctions in the n-well regions wherein the n-well regions are implanted with p-type ions using the n-well implant mask.

10. The method of claim 9 further comprising:

(q) removing the n-well implant mask;

(r) forming a p-well implant mask;

(s) forming NLDD regions in the p-well regions, wherein the NLDD regions in the p-well regions are implanted at a selected angle using the p-well implant mask; and (t) forming source and drain junctions in the p-well regions wherein the p-well regions are implanted with n-type ions using the p-well implant mask.

* * * * *